(12) United States Patent
Suzuki et al.

(10) Patent No.: US 6,954,832 B2
(45) Date of Patent: Oct. 11, 2005

(54) INTERLEAVER FOR ITERATIVE DECODER

(75) Inventors: Hiroshi Suzuki, Irvine, CA (US); Stephen Edward Krafft, Los Angeles, CA (US)

(73) Assignee: Broadcom Corporation, Irvine, CA (US)

( * ) Notice: Subject to any disclaimer, the term of this patent is extended or adjusted under 35 U.S.C. 154(b) by 322 days.

(21) Appl. No.: 10/384,430

(22) Filed: Mar. 8, 2003

(65) Prior Publication Data

US 2003/0225985 A1 Dec. 4, 2003

Related U.S. Application Data

(60) Provisional application No. 60/384,698, filed on May 31, 2002, and provisional application No. 60/435,927, filed on Dec. 20, 2002.

(51) Int. Cl.⁷ .............................................. G06F 12/00
(52) U.S. Cl. ...................... 711/157; 711/167; 711/127; 711/5; 341/81; 375/265
(58) Field of Search ............................ 711/167, 5, 127, 711/157; 341/81; 375/265

(56) References Cited

U.S. PATENT DOCUMENTS

| 5,406,570 | A | 4/1995 | Berrou et al. |
| 5,446,747 | A | 8/1995 | Berrou |
| 5,563,897 | A | 10/1996 | Pyndiah et al. |
| 6,065,147 | A | 5/2000 | Pyndiah et al. |
| 6,119,264 | A | 9/2000 | Berrou et al. |
| 6,122,763 | A | 9/2000 | Pyndiah et al. |
| 6,151,690 | A | * 11/2000 | Peeters ........................ 714/701 |

FOREIGN PATENT DOCUMENTS

| EP | 0 735 696 A2 | 10/1996 |
| EP | 0 735 696 A3 | 1/1999 |
| FR | 91 05278 A1 | 10/1992 |

* cited by examiner

Primary Examiner—Matthew D. Anderson
(74) Attorney, Agent, or Firm—Garlick Harrison & Markison LLP; Shayne X. Short

(57) ABSTRACT

Interleaver for iterative decoder. A memory management scheme allows for single plane/single port memory devices to be used by the interleaver. The design is adaptable to soft-in soft-out (SISO) decoders that perform iterative decoding. The interleaver may be implemented within communication devices that implement two distinct SISOs that operate cooperatively or within communication devices that employ a single SISO (in a recycled embodiment) that functionally performs the analogous decoding operations that would be performed by the two distinct SISO implementation. The use of single plane/single port memory devices by the interleaver allows for a great deal of savings from many perspectives: the sizes of the required interleaver memory and the interleaver pattern memory are both cut in half using this approach, and a cost savings may also be realized, in that, cheaper, slower memories may be used since each respective interleaver memory is read only every other cycle.

35 Claims, 19 Drawing Sheets iterative decoder design

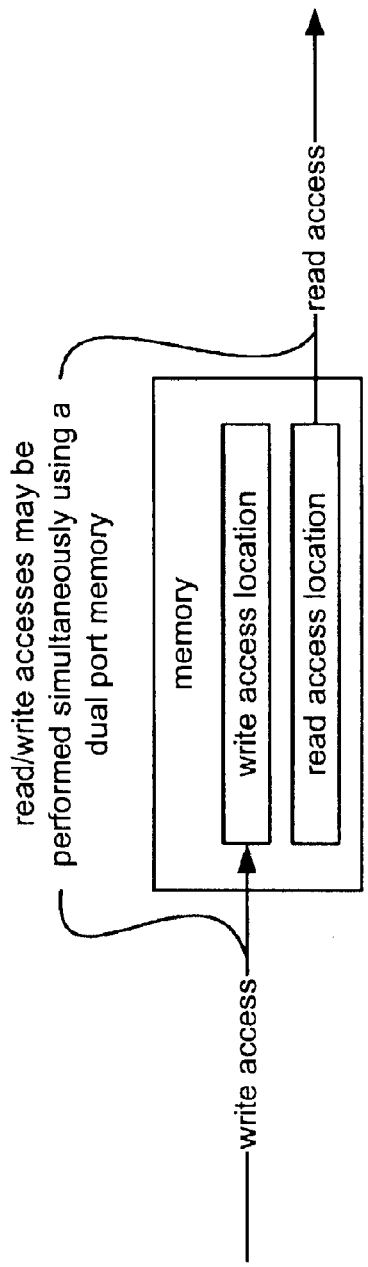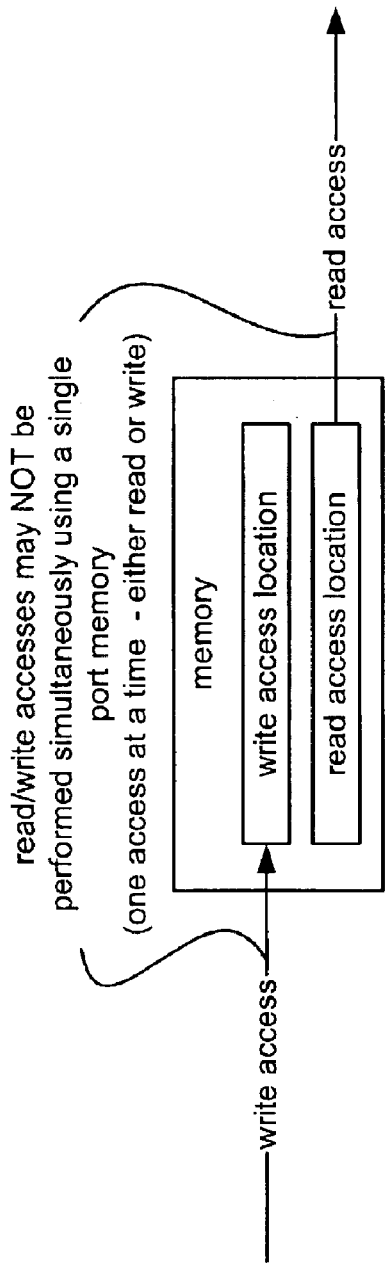

High Definition Television (HDTV) communication system

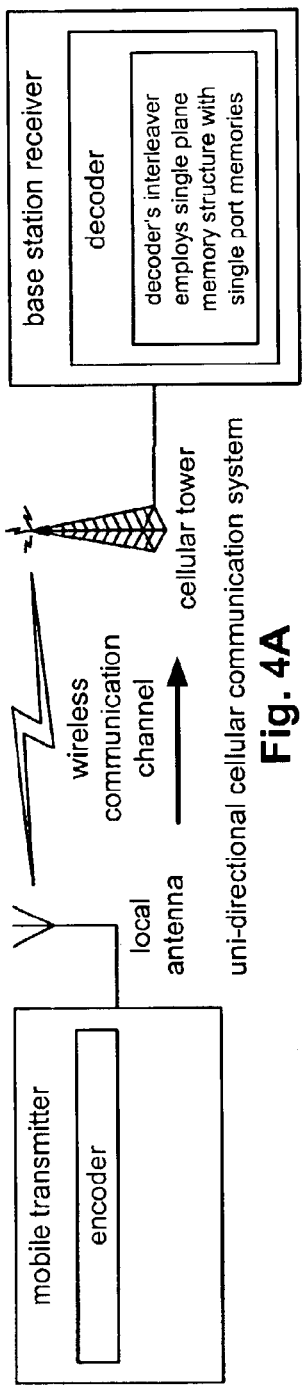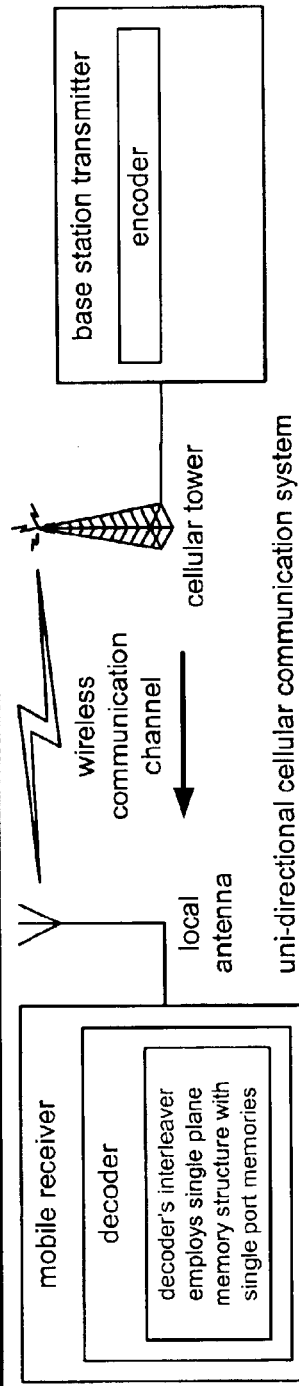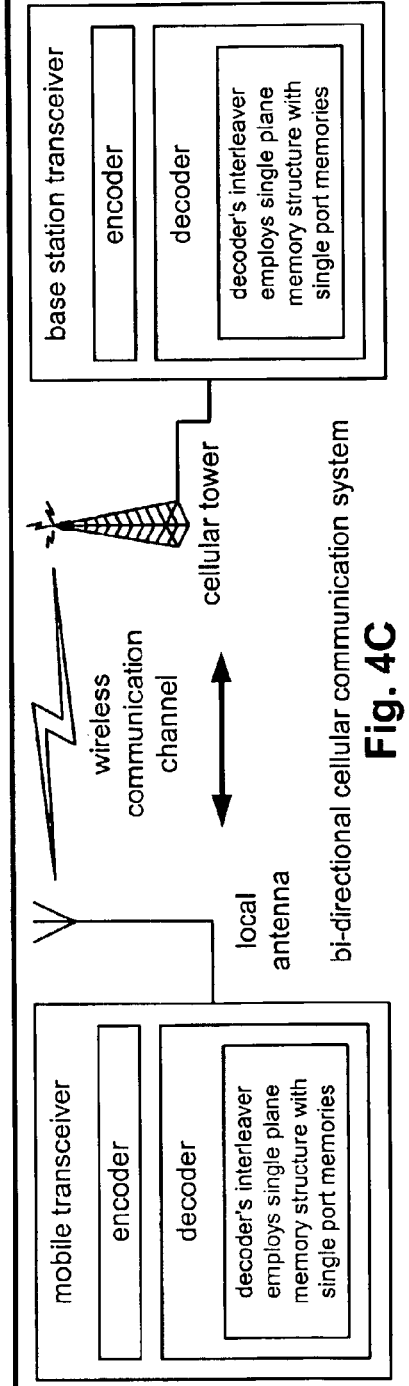

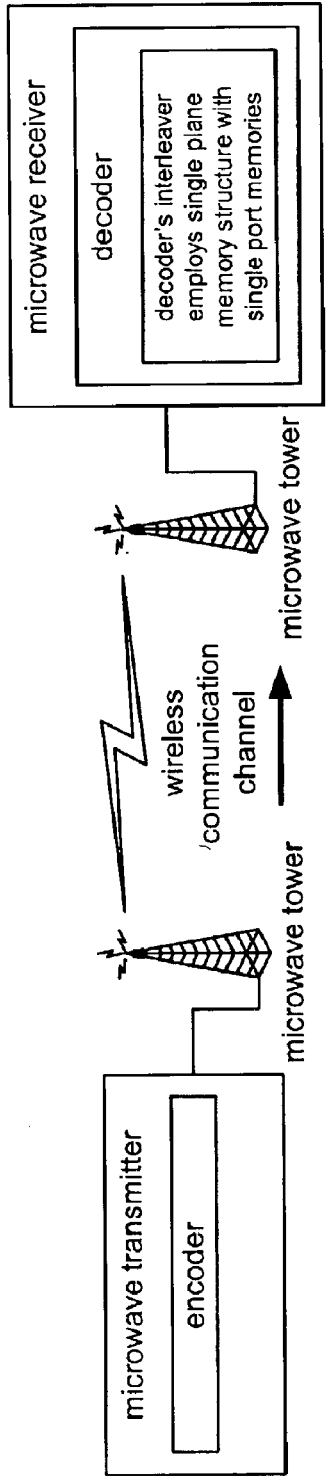
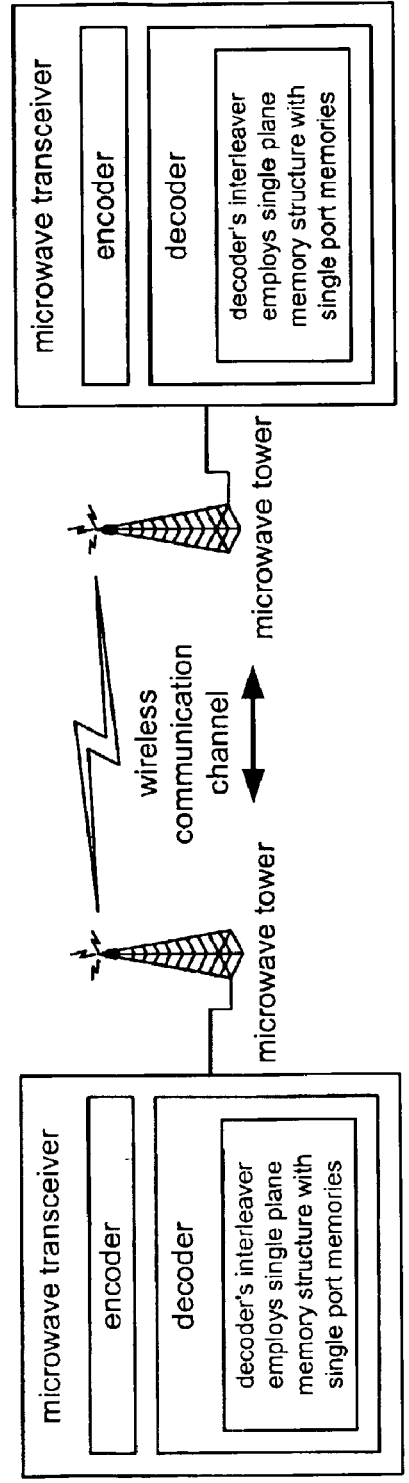

uni-directional point-to-point radio communication system bi-directional point-to-point radio communication system

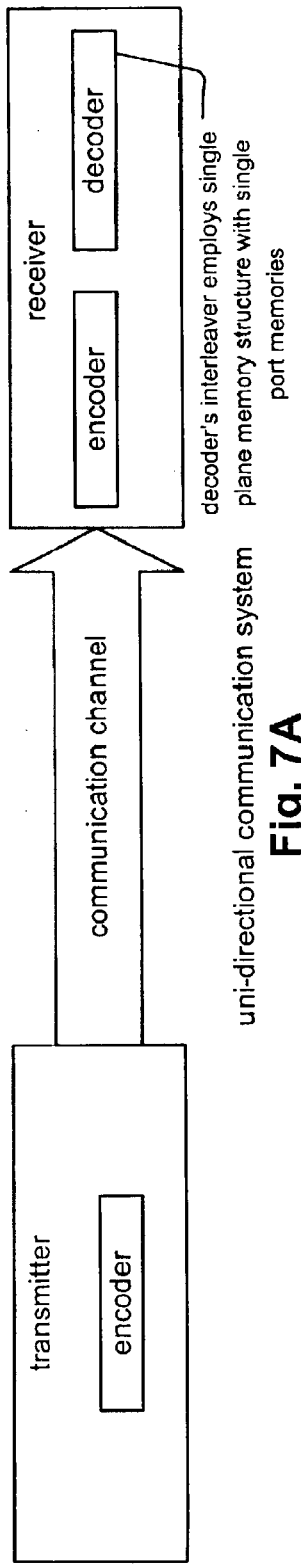
Fig. 7A — uni-directional communication system
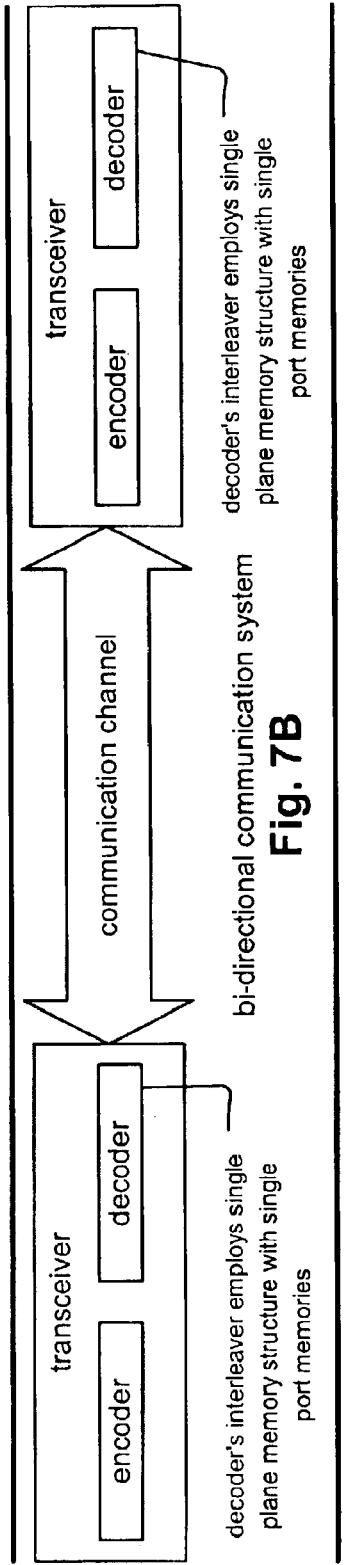
Fig. 7B — bi-directional communication system
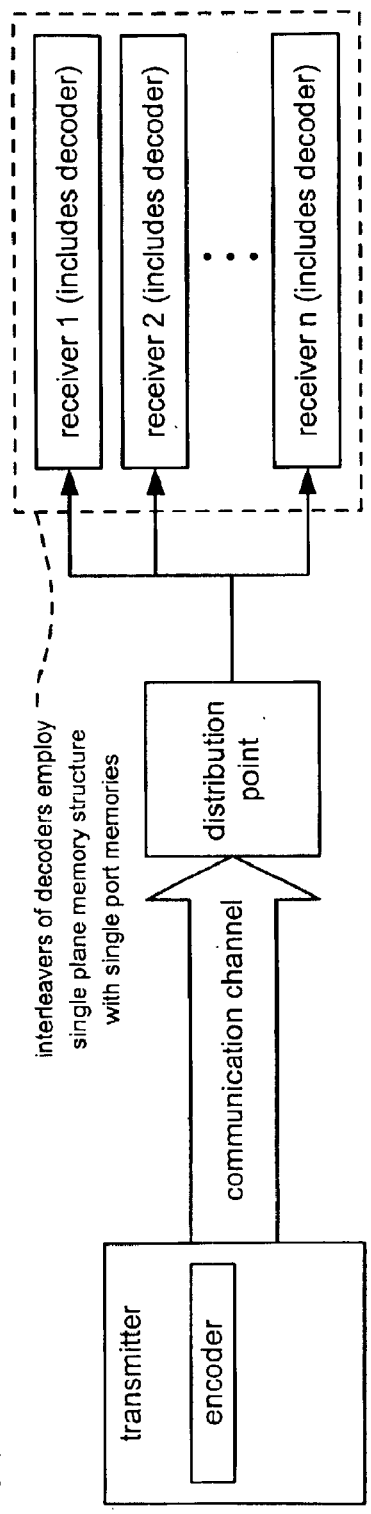
Fig. 7C — one to many communication system fiber-optic communication system satellite receiver set-top box system Fig. 10 iterative decoder design I,Q extraction alternative iterative decoder design (shown as receiving I,Q inputs) that recycles single SISO iterative SISO decoder design (having top and bottom SISOs) with interleaver and de-interleaver iterative single, recycled SISO decoder design with interleaver/de-interleaver

Fig. 14A

| decoding iteration | SISO operation | extrinsic information read | extrinsic information write |
|---|---|---|---|
| 1 | top SISO | none | sequential |
|   | bottom SISO | interleaved | sequential |
| 2 | top SISO | de-interleaved | sequential |
|   | bottom SISO | interleaved | sequential | read/write operations performed by interleaver/de-interleaver memory

Fig. 14B

| decoding iteration | SISO operation | extrinsic information read | extrinsic information write |
|---|---|---|---|
| 1 | top SISO | none | de-interleaved |
|   | bottom SISO | sequential | sequential |
| 2 | top SISO | de-interleaved | de-interleaved |
|   | bottom SISO | sequential | sequential | more efficient read/write operations performed by interleaver/de-interleaver memory partitioning of memory (using single port memories)

alternating read/write processing method using single port memories memory block partitioning for interleaver of iterative decoder interleaver memory processing method interleaver memory timing chart

INTERLEAVER FOR ITERATIVE DECODER

CROSS REFERENCE TO RELATED PATENTS/PATENT APPLICATIONS

The present U.S. Utility Patent Application claims priority pursuant to 35 U.S.C. §119(e) to the following U.S. Provisional Patent Applications which are hereby incorporated herein by reference in their entirety and made part of the present U.S. Utility Patent Application for all purposes:

1. U.S. Provisional Patent Application Ser. No. 60/384,698, entitled "Variable code rate and signal constellation turbo trellis coded modulation codec," filed May 31, 2002, pending.

2. U.S. Provisional Application Ser. No. 60/435,927, "Interleaver for iterative decoder," filed Dec. 20, 2002, pending.

The present U.S. Utility Patent Application also claims priority pursuant to 35 U.S.C. §120 to the following U.S. Utility patent application which is hereby incorporated herein by reference in its entirety and is made part of the present U.S. Utility Patent Application for all purposes:

1. U.S. Utility application Ser. No. 10/264,486, entitled "Variable code rate and signal constellation turbo trellis coded modulation codec," filed Oct. 4, 2002, pending.

BACKGROUND OF THE INVENTION

1. Technical Field of the Invention

The invention relates generally to communication systems; and, more particularly, it relates to decoding of encoded signals within such communication systems.

2. Description of Related Art

Data communication systems have been under continual development for many years. One such type of communication system that has been of significant interest lately is a communication system that employs turbo codes. Another type of communication system that has also received interest is a communication system that employs Low Density Parity Check (LDPC) code. A primary directive in these areas of development has been to try continually to lower the error floor within a communication system. The ideal goal has been to try to reach Shannon's limit in a communication channel. Shannon's limit may be viewed as being the data rate to be used in a communication channel, having a particular Signal to Noise Ratio (SNR), that achieves error free transmission through the communication channel. In other words, the Shannon limit is the theoretical bound for channel capacity for a given modulation and code rate.

LDPC code has been shown to provide for excellent decoding performance that can approach the Shannon limit in some cases. For example, some LDPC decoders have been shown to come within 0.3 dB from the theoretical Shannon limit. While this example was achieved using an irregular LDPC code of a length of one million, it nevertheless demonstrates the very promising application of LDPC codes within communication systems.

In performing calculations when decoding a received signal within such communication systems, it is common for these decoders to perform interleaving and/or de-interleaving of the received data to some degree. The memory required and the memory management required to do this interleaving is oftentimes quite difficult. For example, the amount of memory required to store the interleaver pattern (the interleaver pattern memory) is typically very large. In addition, the actual interleaver memory that is employed to perform the writing and reading of the received symbols according to the interleaver pattern is also typically quite large. The prior art approach to support such interleaving is to employ dual port memory devices.

FIG. 1A is a diagram illustrating a prior art dual port memory structure. A dual port memory device allows for two simultaneous read and write operations to be performed to the memory. For example, a write access may be performed to the memory at one location at the same time that a read access may be performed to the memory at another location. These dual port memory structures are oftentimes typically quite large in area (real estate) and oftentimes quite expensive. For communication systems where area and/or cost are important design directives, the use of dual port memory structures may be inherently prohibited. However, as is discussed below, the use of single port memory structures is insufficient to meet the needs within communication systems.

FIG. 1B is a diagram illustrating a prior art single port memory structure. In contradistinction to the dual port memory structure described above, a single port memory structure will allow only one memory access operation at a time (be it read or write). These single port memory structures are typically much cheaper in cost than the dual port memory structures described above. However, prior art decoding techniques that employ interleaving oftentimes need to operate at such high speeds that single port memory devices cannot be used. As data rates continue to increase within such communication systems, there appears in the prior art no place for single port memory devices to be used within the interleaving processing given that the current direction of development within communication systems is towards higher operational speeds and higher amounts of throughput.

BRIEF SUMMARY OF THE INVENTION

Various aspects of the invention can be found in any number of devices that perform processing and decoding of received data. Specifically, some aspects of the invention may be found in such devices that employ a novel interleaver memory structure that facilitates the decoding of encoded symbols. The encoding symbols may be received in a burst format mode and/or a continuous stream format mode. The operation of the memory structure may be viewed in looking at what happens in sequential time periods. The reading and writing of data in the interleaved and/or de-interleaved manner is performed in an alternating manner. For example, when reading is performed to one memory device, then writing is performed to another, and vice versa.

For example, each of the entire interleaver memory and the entire interleaver pattern memory is broken into two separate memory portions that are each implemented using single port memory structures. One of the memory structures is employed for odd address locations, and another memory structure is employed for even address locations. The novel approach of performing data addressing and memory management allows the use of all single port memory structures thereby providing a great deal of savings from many perspectives. From one perspective, the sizes of the required interleaver memory and the interleaver pattern memory are both cut in half using this approach. In addition, a cost savings may also be realized, in that, cheaper, slower memories may be used since each respective interleaver memory is read only every other cycle (not every cycle).

Looking at the operation of one embodiment of the invention, the processing of the interleaver may be better understood at what happens during successive clock cycles. Initially, during a first clock cycle, two operations are simultaneously performed. A first interleaver pattern memory receives a first sequential read address, and a second interleaver pattern memory receives a first sequential write address.

During a second clock cycle, four operations are simultaneously performed. The first interleaver pattern memory receives a second sequential write address, and the second interleaver pattern memory receives a second sequential read address. In addition, a first read address is received from the first interleaver pattern memory for use by a first interleaver memory, and a first write address is received from the second interleaver pattern memory for use by a second interleaver memory.

During a third clock cycle, six operations are simultaneously performed. During a third clock cycle, the first interleaver pattern memory receives a third sequential read address, and the second interleaver pattern memory receives a third sequential write address. Also during this third cycle, a second write address is received from the first interleaver pattern memory for use by the first interleaver memory, and a second read address is received from the second interleaver pattern memory for use by the second interleaver memory. In addition, during this third cycle, a first data is read from the first interleaver memory, and a second data is written to the second interleaver memory. The operation of this embodiment may continue on as well for subsequent clock cycles without departing from the scope and spirit of the invention.

In some embodiments, the read accesses and write accesses may be viewed as being alternatively performed within each of the first interleaver memory and the second interleaver memory. The read addresses and their corresponding sequential write addresses are offset by an odd value to assist in the memory management operation described herein. Multiplexors (MUXes) may be employed to implement the interleaver memory structure. For example, a first multiplexor (MUX) may be used to receive the first sequential read address and the first sequential write address as inputs during the first clock cycle and to provide the first sequential read address to the first interleaver pattern memory, and a second MUX may be used to receive the first sequential read address and the first sequential write address as inputs during the first clock cycle and to provide the first sequential write address to the second interleaver pattern memory. Then, during the second clock cycle, the first MUX receives the second sequential read address and the second sequential write address as inputs during the second clock cycle and provides the second sequential write address to the first interleaver pattern memory, and the second MUX receives the second sequential read address and the second sequential write address as inputs during the second clock cycle and provides the second sequential read address to the second interleaver pattern memory.

As mentioned above, the interleaver memory structure may be implemented in a wide variety of devices including an iterative soft-in soft-out (SISO) decoder. The SISO decoder may be implemented as including one or more soft-in soft-out (SISO) decoder functional blocks such as a top SISO and a bottom SISO. Alternatively, the functionality of a top SISO and a bottom SISO may be implemented in a single, recycled SISO that alternatively performs the functionality of the top and bottom SISO of such an embodiment. For example, the interleaver memory structure may be employed by a SISO decoder that includes a top SISO and a bottom SISO such that the top SISO provides extrinsic information that is fed back to the bottom SISO in an interleaved order during a first SISO operation, and such that the bottom SISO provides extrinsic information that is fed back to the top SISO in a de-interleaved order during a second SISO operation. Alternatively, when the SISO decoder is implemented as a single, recycled SISO decoder, the SISO provides extrinsic information that is fed back to the SISO in an interleaved order during a first SISO operation, and the SISO provides extrinsic information that is fed back to the SISO in a de-interleaved order during a second SISO operation.

The invention is also operable to accommodate encoded symbols that are encoded according to various rate controls. For example, the encoded symbols may be encoded according to a rate control sequence having a number of rate controls arranged in a period. At least one rate control of the rate controls includes a modulation that includes a constellation having a mapping. Different rate controls may also have different characteristics as well. For example, a first rate control of the may include a first modulation that includes a first constellation having a first mapping, and a second rate control may include a second modulation that includes a second constellation having a second mapping.

One embodiment of the interleaver memory structure is employed by device that includes a SISO decoder and an output processor arranged in a manner as described below. The decoder employs a trellis to decode the encoded symbols, and each of the encoded symbols is encoded according to a rate control sequence having a number of rate controls arranged in a period. In this embodiment, the SISO decoder includes a top SISO and a bottom SISO. The top SISO, based on trellis metrics, calculates a first group of extrinsic values for each encoded symbol according to the respective rate control. The interleaver memory structure then interleaves the first group of extrinsic values to generate a first "a priori probability" (app) information. The bottom SISO, based on the trellis metrics, calculates a second group of extrinsic values for each encoded symbol according to the respective rate control. The interleaver memory structure then de-interleaves the second group of extrinsic values to generate a second "a priori probability" (app) information. The first "a priori probability" (app) information is fed back to the bottom SISO, and the second "a priori probability" (app) information is fed back to the top SISO. The top SISO and the bottom SISO operate cooperatively to perform at least one iteration of iterative decoding to generate soft symbol decisions such that each soft symbol decision of the plurality of soft symbol decisions corresponds to one of the encoded symbols. In addition, the device includes the output processor, communicatively coupled to the bottom SISO, that generates a hard symbol decision for each soft symbol decision thereby making a best estimate for each encoded symbol.

The interleaver memory structure may also be employed to accommodate a wide variety of codes. For example, the interleaver memory structure is operable to accommodate symbols that have been encoded using any one of TTCM (Turbo Trellis Coded Modulation), PC-TCM (Parallel Concatenated Trellis Coded Modulation), and/or Trellis Code Modulation (TCM). Moreover, the interleaver memory structure may be included within a variety of different devices including a decoder that is implemented within a communication receiver. The communication receiver itself may be implemented within a variety of communication systems including any one of a satellite communication system, a High Definition Television (HDTV) communication system, a cellular communication system, a microwave communication system, a point-to-point communication system, a uni-directional communication system, a bi-directional communication system, a one to many communication system, and a fiber-optic communication system.

Other aspects of the invention may also be found in a method that performs any of the various embodiments of interleaver memory management described herein that are performed according to the various aspects of the invention.

BRIEF DESCRIPTION OF THE SEVERAL VIEWS OF THE DRAWINGS

FIG. 1A is a diagram illustrating a prior art dual port memory structure.

FIG. 1B is a diagram illustrating a prior art single port memory structure.

FIG. 4A and FIG. 4B are system diagrams illustrating embodiments of unidirectional cellular communication systems that are built according to the invention.

FIG. 4C is a system diagram illustrating embodiment of a bi-directional cellular communication system that is built according to the invention.

FIG. 5A is a system diagram illustrating an embodiment of a uni-directional microwave communication system that is built according to the invention.

FIG. 5B is a system diagram illustrating an embodiment of a bi-directional microwave communication system that is built according to the invention.

FIG. 7A is a system diagram illustrating an embodiment of a uni-directional communication system that is built according to the invention.

FIG. 7B is a system diagram illustrating an embodiment of a bi-directional communication system that is built according to the invention.

FIG. 7C is a system diagram illustrating an embodiment of a one to many communication system that is built according to the invention.

FIG. 14A is a diagram illustrating an embodiment of read/write operations performed by an interleaver/de-interleaver memory according to the invention.

FIG. 14B is a diagram illustrating another, more efficient embodiment of read/write operations performed by an interleaver/de-interleaver memory according to the invention.

DETAILED DESCRIPTION OF THE INVENTION

The invention involves several aspects of a novel and very efficient interleaver memory management approach for used in a decoder that is, in one embodiment, tailored for use in decoding signals encoded using TTCM (Turbo Trellis Coded Modulation), PC-TCM (Parallel Concatenated Trellis Coded Modulation), and/or Trellis Code Modulation (TCM). The invention employs a design that is readily adaptable to support decoding of signals that may vary on a symbol by symbol basis of having variable code rates, variable modulation types, various constellation shapes and/or variable mappings for those constellation shapes as well.

The interleaver designed according to the invention employs a memory design and addressing scheme that allows the use of all single port memory devices. Each of the entire interleaver memory and the entire interleaver pattern memory is broken into two separate memory portions that are each implemented using single port memory structures. One of the memory structures is employed for odd address locations, and another memory structure is employed for even address locations. As for the read and write addresses employed in accordance with the invention, an odd valued offset is maintained between the sequential read addresses and the sequential write addresses that are provided to the two separate interleaver pattern memories. In addition, when a read access is performed at an odd address in one of the interleaver memories, a write access is performed at an even address in the other interleaver memory. This alternative processing continues on such that when a write access is performed at an even address in one of the interleaver memories, a read access is performed at an odd address in the other interleaver memory. The reading and writing will alternate back and forth between the two interleaver memories (odd and even) during the processing of the entire portion of data.

The use of single port memories to perform the interleaving obviates the need to employ expensive dual port memories as is required according to the approaches in the prior art. Moreover, the interleaver pattern memory size is cut in half using the single port memory arrangement approach provided by the invention. More details are presented below regarding various structural and operational embodiments of using single port memory devices to support the interleaving and/or an analogous single port memory management approach.

Figure 2:
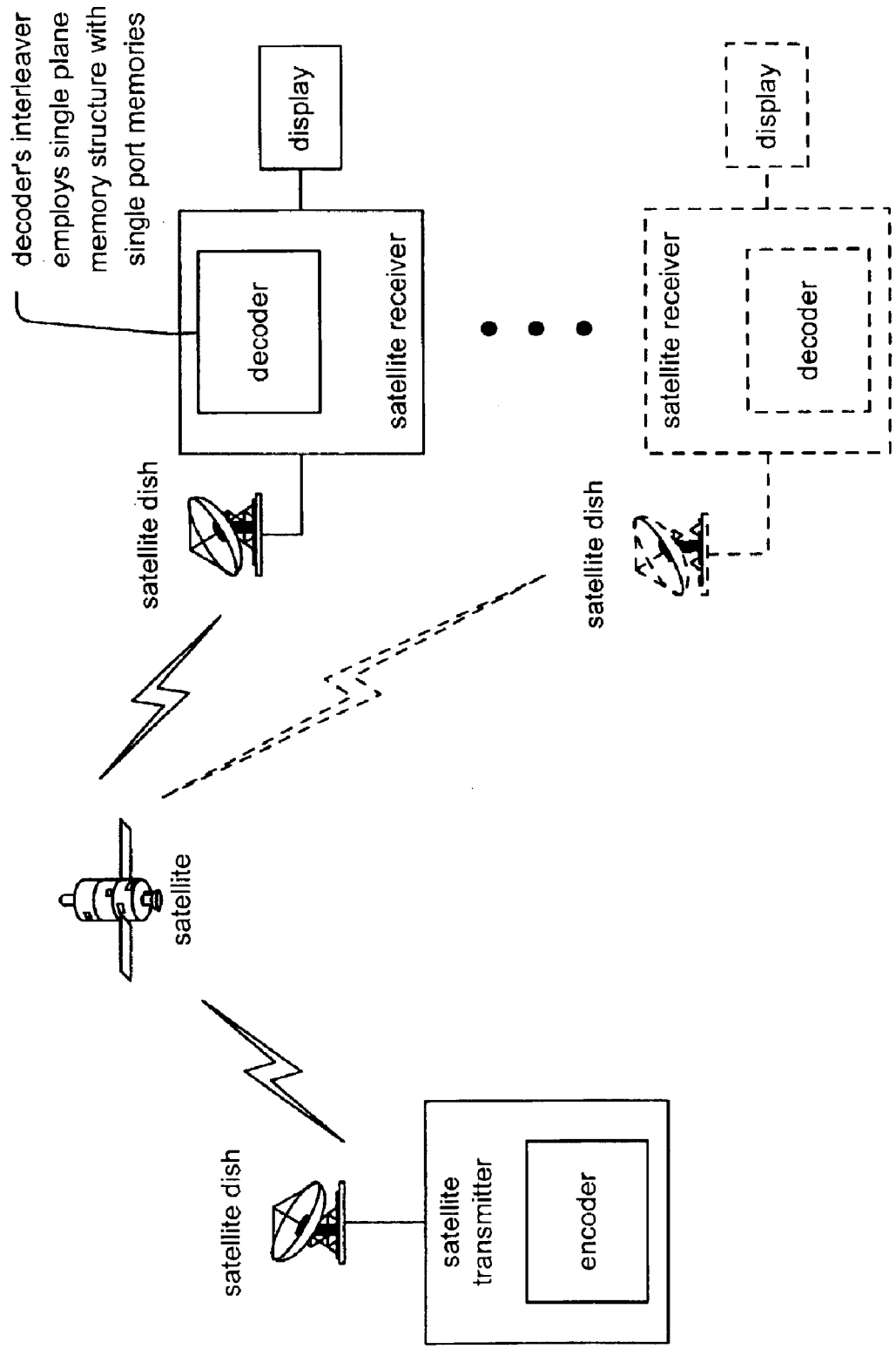
FIG. 2 is a system diagram illustrating an embodiment of a satellite communication system that is built according to the invention.

FIG. 2 is a system diagram illustrating an embodiment of a satellite communication system that is built according to the invention. A satellite transmitter is communicatively coupled to a satellite dish that is operable to communicate with a satellite. The satellite transmitter may also be communicatively coupled to a wired network. This wired network may include any number of networks including the Internet, proprietary networks, and/or other wired networks. The satellite transmitter employs the satellite dish to communicate to the satellite via a wireless communication channel. The satellite is able to communicate with one or more satellite receivers (each having a satellite dish). Each of the satellite receivers may also be communicatively coupled to a display.

Here, the communication to and from the satellite may cooperatively be viewed as being a wireless communication channel, or each of the communication to and from the satellite may be viewed as being two distinct wireless communication channels.

For example, the wireless communication "channel" may be viewed as not including multiple wireless hops in one embodiment. In other multi-hop embodiments, the satellite receives a signal received from the satellite transmitter (via its satellite dish), amplifies it, and relays it to satellite receiver (via its satellite dish); the satellite receiver may also be implemented using terrestrial receivers such as satellite receivers, satellite based telephones, and/or satellite based Internet receivers, among other receiver types. In the case where the satellite receives a signal received from the satellite transmitter (via its satellite dish), amplifies it, and relays it, the satellite may be viewed as being a "transponder;" this is a multi-hop embodiment. In addition, other satellites may exist that perform both receiver and transmitter operations in cooperation with the satellite shown. In this case, each leg of an up-down transmission via the wireless communication channel may be considered separately.

In whichever embodiment, the satellite communicates with the satellite receiver. The satellite receiver may be viewed as being a mobile unit in certain embodiments (employing a local antenna); alternatively, the satellite receiver may be viewed as being a satellite earth station that may be communicatively coupled to a wired network in a similar manner in which the satellite transmitter may also be communicatively coupled to a wired network.

The satellite transmitter is operable to encode information (using an encoder) that is to be transmitted to the satellite receiver; the satellite receiver is operable to decode the transmitted signal (using a decoder). Any one or more of the decoders implemented within the satellite receivers may be implemented to support the interleaving of the invention that employs single port memories. The FIG. 2 shows just one embodiment of how the interleaving approach of the invention may be performed within a communication system.

Figure 3:
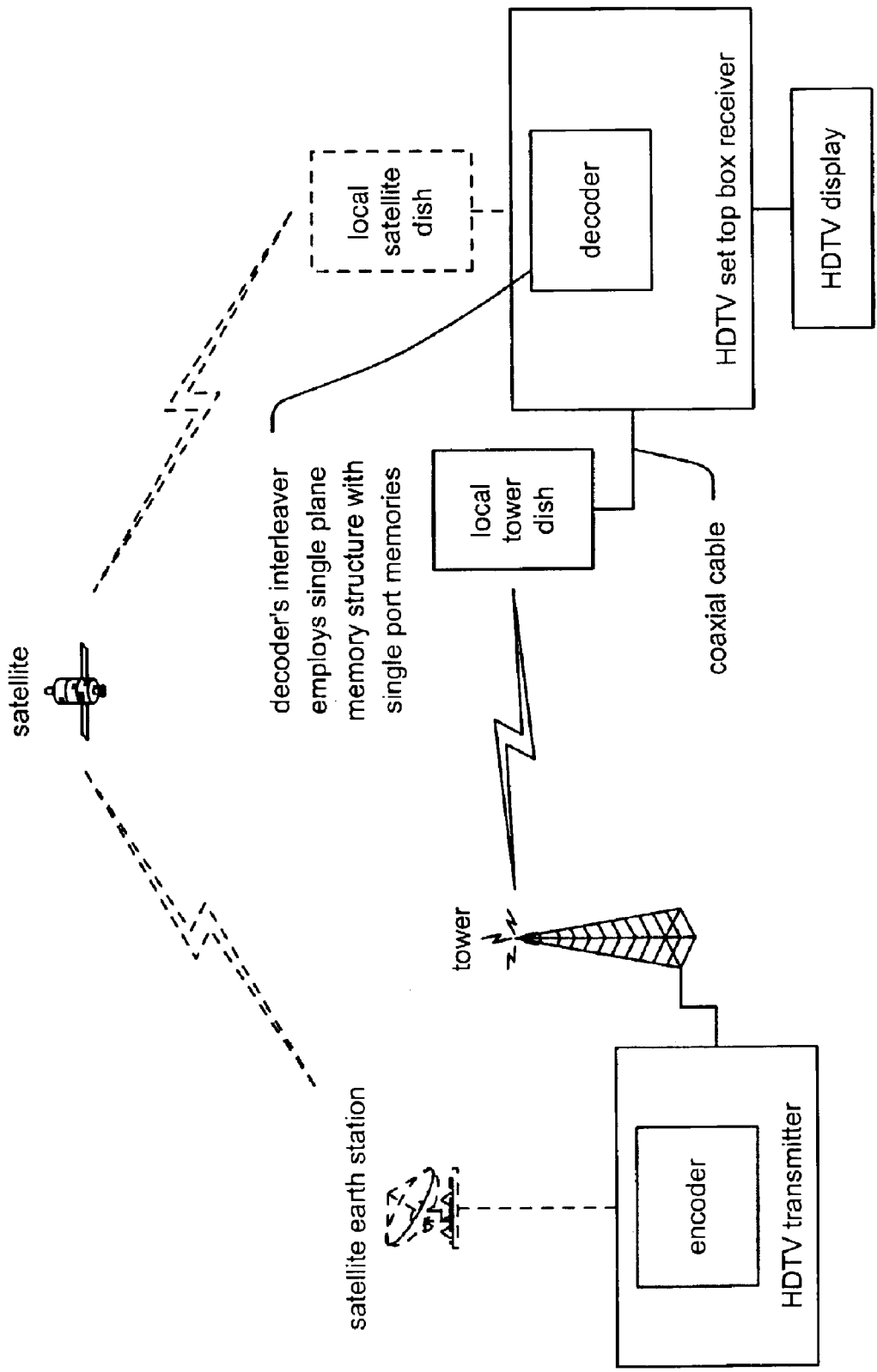
FIG. 3 is a system diagram illustrating an embodiment of a High Definition Television (HDTV) communication system that is built according to the invention.

FIG. 3 is a system diagram illustrating an embodiment of a High Definition Television (HDTV) communication system that is built according to the invention. An HDTV transmitter is communicatively coupled to a tower. The HDTV transmitter, using its tower, transmits a signal to a local tower dish via a wireless communication channel. The local tower dish communicatively couples to an HDTV set top box receiver via a coaxial cable or some other communication means. The HDTV set top box receiver includes the functionality to receive the wireless transmitted signal that has been received by the local tower dish; this may include any transformation and/or down-converting that may be needed to accommodate any up-converting that may have been performed before and during transmission of the signal from the HDTV transmitter and its tower. Some example may include transforming down to intermediate frequencies (IFs) and then down to baseband (BB) and/or directly converting down to BB in other embodiments.

The HDTV set top box receiver is also communicatively coupled to an HDTV display that is able to display the demodulated and decoded wireless transmitted signals received by the HDTV set top box receiver and its local tower dish. The HDTV transmitter (via its tower) transmits a signal directly to the local tower dish via the wireless communication channel in this embodiment. In alternative embodiments, the HDTV transmitter may first receive a signal from a satellite, using a satellite earth station that is communicatively coupled to the HDTV transmitter, and then transmit this received signal to the local tower dish via the wireless communication channel. In this situation, the HDTV transmitter operates as a relaying element to transfer a signal originally provided by the satellite that is destined for the HDTV set top box receiver. For example, another satellite earth station may first transmit a signal to the satellite from another location, and the satellite may relay this signal to the satellite earth station that is communicatively coupled to the HDTV transmitter. The HDTV transmitter performs receiver functionality and then transmits its received signal to the local tower dish.

In even other embodiments, the HDTV transmitter employs its satellite earth station to communicate to the satellite via a wireless communication channel. The satellite is able to communicate with a local satellite dish; the local satellite dish communicatively couples to the HDTV set top box receiver via a coaxial cable. This path of transmission shows yet another communication path where the HDTV set top box receiver may communicate with the HDTV transmitter.

In whichever embodiment and whichever signal path the HDTV transmitter employs to communicate with the HDTV set top box receiver, the HDTV set top box receiver is operable to receive communication transmissions from the HDTV transmitter.

The HDTV transmitter is operable to encode information (using an encoder) that is to be transmitted to the HDTV set top box receiver; the HDTV set top box receiver is operable to decode the transmitted signal (using a decoder). The decoder within the HDTV set top box receiver may be implemented to support the interleaving of the invention that employs single port memories. The FIG. 3 shows yet another embodiment of how the interleaving approach of the invention may be performed within a communication system.

FIG. 4A and FIG. 4B are system diagrams illustrating embodiments of unidirectional cellular communication systems that are built according to the invention.

Referring to the FIG. 4A, a mobile transmitter includes a local antenna communicatively coupled thereto. The mobile transmitter may be any number of types of transmitters including a one way cellular telephone, a wireless pager unit, a mobile computer having transmit functionality, and/or any other type of mobile transmitter. The mobile transmitter transmits a signal, using its local antenna, to a cellular tower via a wireless communication channel. The cellular tower is communicatively coupled to a base station receiver; the receiving tower is operable to receive data transmission from the local antenna of the mobile transmitter that has been communicated via the wireless communication channel. The cellular tower communicatively couples the received signal to the base station receiver.

The mobile transmitter is operable to encode information (using an encoder) that is to be transmitted to the base station receiver; the base station receiver is operable to decode the transmitted signal (using a decoder). The decoder within the base station receiver may be implemented to support the interleaving of the invention that employs single port memories. The FIG. 4A shows yet another embodiment of how the interleaving approach of the invention may be performed within a communication system. The FIG. 4A shows a uni-directional cellular communication system where the communication goes from the mobile transmitter to the base station receiver via the wireless communication channel.

Referring to the FIG. 4B, a base station transmitter includes a cellular tower communicatively coupled thereto. The base station transmitter, using its cellular tower, transmits a signal to a mobile receiver via a communication channel. The mobile receiver may be any number of types of receivers including a one-way cellular telephone, a wireless pager unit, a mobile computer having receiver functionality, or any other type of mobile receiver. The mobile receiver is communicatively coupled to a local antenna; the local antenna is operable to receive data transmission from the cellular tower of the base station transmitter that has been communicated via the wireless communication channel. The local antenna communicatively couples the received signal to the mobile receiver.

The base station transmitter is operable to encode information (using an encoder) that is to be transmitted to the mobile receiver; the mobile receiver is operable to decode the transmitted signal (using a decoder). The decoder within the mobile receiver may be implemented to support the interleaving of the invention that employs single port memories. The FIG. 4B shows yet another embodiment of how the interleaving approach of the invention may be performed within a communication system. The FIG. 4B shows a uni-directional cellular communication system where the communication goes from the base station transmitter to the mobile receiver via the wireless communication channel.

The FIG. 4C shows a bi-directional cellular communication system where the communication can go to and from the base station transceiver and to and from the mobile transceiver via the wireless communication channel.

Referring to the FIG. 4C, a base station transceiver includes a cellular tower communicatively coupled thereto. The base station transceiver, using its cellular tower, transmits a signal to a mobile transceiver via a communication channel. The reverse communication operation may also be performed. The mobile transceiver is able to transmit a signal to the base station transceiver as well. The mobile transceiver may be any number of types of transceiver including a cellular telephone, a wireless pager unit, a mobile computer having transceiver functionality, or any other type of mobile transceiver. The mobile transceiver is communicatively coupled to a local antenna; the local antenna is operable to receive data transmission from the cellular tower of the base station transceiver that has been communicated via the wireless communication channel. The local antenna communicatively couples the received signal to the mobile transceiver.

The base station transceiver is operable to encode information (using an encoder) that is to be transmitted to the mobile transceiver; the mobile transceiver is operable to decode the transmitted signal (using a decoder). The decoder within either one or both of the mobile transceiver and the base station transceiver may be implemented to support the interleaving of the invention that employs single port memories. The FIG. 4C shows yet another embodiment of how the interleaving approach of the invention may be performed within a communication system.

FIG. 5A is a system diagram illustrating an embodiment of a uni-directional microwave communication system that is built according to the invention. A microwave transmitter is communicatively coupled to a microwave tower. The microwave transmitter, using its microwave tower, transmits a signal to a microwave tower via a wireless communication channel. A microwave receiver is communicatively coupled to the microwave tower. The microwave tower is able to receive transmissions from the microwave tower that have been communicated via the wireless communication channel.

The microwave transmitter is operable to encode information (using an encoder) that is to be transmitted to the microwave receiver; the microwave receiver is operable to decode the transmitted signal (using a decoder). The decoder within the microwave receiver may be implemented to support the interleaving of the invention that employs single port memories. The FIG. 5A shows yet another embodiment of how the interleaving approach of the invention may be performed within a communication system. The FIG. 5A shows a uni-directional microwave communication system where the communication goes from the microwave transmitter to the microwave receiver via the wireless communication channel.

FIG. 5B is a system diagram illustrating an embodiment of a bi-directional microwave communication system that is built according to the invention. Within the FIG. 5B, a first microwave transceiver is communicatively coupled to a first microwave tower. The first microwave transceiver, using the first microwave tower (the first microwave transceiver's microwave tower), transmits a signal to a second microwave tower of a second microwave transceiver via a wireless communication channel. The second microwave transceiver is communicatively coupled to the second microwave tower (the second microwave transceiver's microwave tower). The second microwave tower is able to receive transmissions from the first microwave tower that have been communicated via the wireless communication channel. The reverse communication operation may also be performed using the first and second microwave transceivers.

Each of the microwave transceivers is operable to encode information (using an encoder) that is to be transmitted to the other microwave transceiver; each microwave transceiver is operable to decode the transmitted signal (using a decoder) that it receives. Each of the microwave transceivers includes an encoder and a decoder. The decoder within either one or both of the microwave transceivers may be implemented to support the interleaving of the invention that employs single port memories. The FIG. 5B shows yet another embodiment of how the interleaving approach of the invention may be performed within a communication system.

Figure 6A:
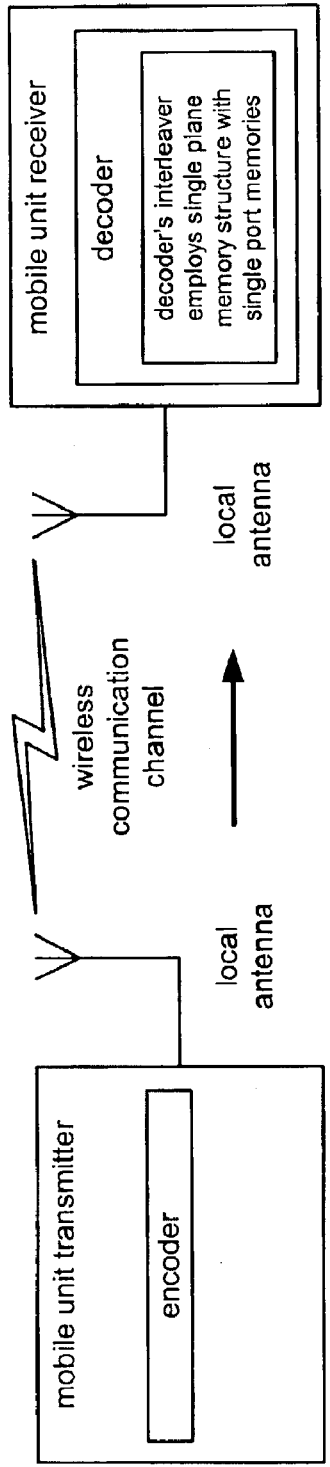
FIG. 6A is a system diagram illustrating an embodiment of a uni-directional point-to-point radio communication system that is built according to the invention.

FIG. 6A is a system diagram illustrating an embodiment of a uni-directional point-to-point radio communication system that is built according to the invention. A mobile unit transmitter includes a local antenna communicatively coupled thereto. The mobile unit transmitter, using its local antenna, transmits a signal to a local antenna of a mobile unit receiver via a wireless communication channel.

The mobile unit transmitter is operable to encode information (using an encoder) that is to be transmitted to the mobile unit receiver; the mobile unit receiver is operable to decode the transmitted signal (using a decoder). The decoder within the mobile receiver may be implemented to support the interleaving of the invention that employs single port memories. The FIG. 6A shows yet another embodiment of how the interleaving approach of the invention may be performed within a communication system. The FIG. 6A shows a uni-directional communication system where the communication goes from the mobile unit transmitter to the mobile unit receiver via the wireless communication channel.

Figure 6B:
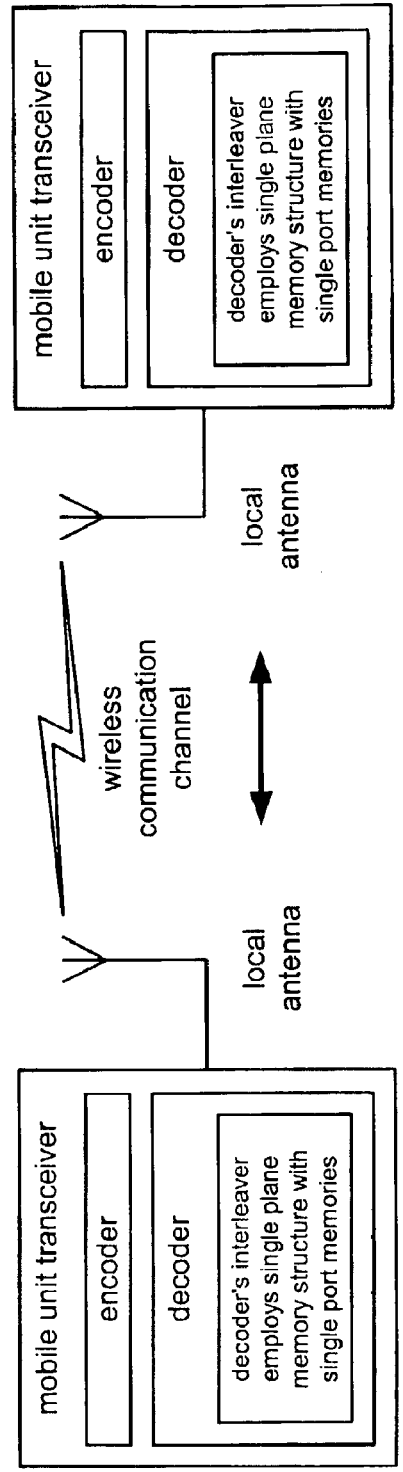
FIG. 6B is a system diagram illustrating an embodiment of a bi-directional point-to-point radio communication system that is built according to the invention.

FIG. 6B is a system diagram illustrating an embodiment of a bi-directional point-to-point radio communication system that is built according to the invention. Within the FIG. 6B, a first mobile unit transceiver is communicatively coupled to a first local antenna. The first mobile unit transceiver, using the first local antenna (the first mobile unit transceiver's local antenna), transmits a signal to a second local antenna of a second mobile unit transceiver via a wireless communication channel. The second mobile unit transceiver is communicatively coupled to the second local antenna (the second mobile unit transceiver's local antenna). The second local antenna is able to receive transmissions from the first local antenna that have been communicated via the communication channel. The reverse communication operation may also be performed using the first and second mobile unit transceivers.

Each mobile unit transceiver is operable to encode information (using an encoder) that is to be transmitted to the other mobile unit transceiver; each mobile unit transceiver is operable to decode the transmitted signal (using a decoder) that it receives. The decoder within either of the mobile unit transceivers may be implemented to support the interleaving of the invention that employs single port memories. The FIG. 6B shows yet another embodiment of how the interleaving approach of the invention may be performed within a communication system.

FIG. 7A is a system diagram illustrating an embodiment of a uni-directional communication system that is built according to the invention. A transmitter communicates to a receiver via a uni-directional communication channel. The uni-directional communication channel may be a wireline (or wired) communication channel or a wireless communication channel without departing from the scope and spirit of the invention. The wired media by which the uni-directional communication channel may be implemented are varied, including coaxial cable, fiber-optic cabling, and copper cabling, among other types of "wiring." Similarly, the wireless manners in which the uni-directional communication channel may be implemented are varied, including satellite communication, cellular communication, microwave communication, and radio communication, among other types of wireless communication.

The transmitter is operable to encode information (using an encoder) that is to be transmitted to the receiver; the receiver is operable to decode the transmitted signal (using a decoder). The decoder within the receiver may be implemented to support the interleaving of the invention that employs single port memories. The FIG. 7A shows yet another embodiment of how the interleaving approach of the invention may be performed within a communication system. The FIG. 7A shows a uni-directional communication system where the communication goes from the transmitter to the receiver via the communication channel.

FIG. 7B is a system diagram illustrating an embodiment of a bi-directional communication system that is built according to the invention. Within the FIG. 7B, a first transceiver is communicatively coupled to a second transceiver via a bi-directional communication channel. The bi-directional communication channel may be a wireline (or wired) communication channel or a wireless communication channel without departing from the scope and spirit of the invention. The characteristics of the wired and/or wireless communication channel may be varied as also described above.

Each of the transceivers is operable to encode information (using an encoder) that is to be transmitted to the other transceiver; each transceiver is operable to decode the transmitted signal (using a decoder) that it receives. The decoder of either of the transceivers may be implemented to support the interleaving of the invention that employs single port memories. The FIG. 7B shows yet another embodiment of how the interleaving approach of the invention may be performed within a communication system.

FIG. 7C is a system diagram illustrating embodiment of a one to many communication system that is built according to the invention. A transmitter is able to communicate, via broadcast in certain embodiments, with a number of receivers, shown as receivers 1, 2, . . . , n via a uni-directional communication channel. The uni-directional communication channel may be a wireline (or wired) communication channel or a wireless communication channel without departing from the scope and spirit of the invention. Again, the characteristics of the wired and/or wireless communication channel may be varied as also described above.

A distribution point is employed within the one to many communication system to provide the appropriate communication to the receivers 1, 2, . . . , and n. In certain embodiments, the receivers 1, 2, . . . , and n each receive the same communication and individually discern which portion of the total communication is intended for that particular receiver.

The transmitter is operable to encode information (using an encoder) that is to be transmitted to the receivers 1, 2, . . . , and n; each of the receivers 1, 2, . . . , and n is operable to decode the transmitted signal (using a decoder). The decoders within any one or all of the receivers 1, 2, . . . , and n may be implemented to support the interleaving of the invention that employs single port memories. The FIG. 7C shows yet another embodiment of how the interleaving approach of the invention may be performed within a communication system.

Figure 8:
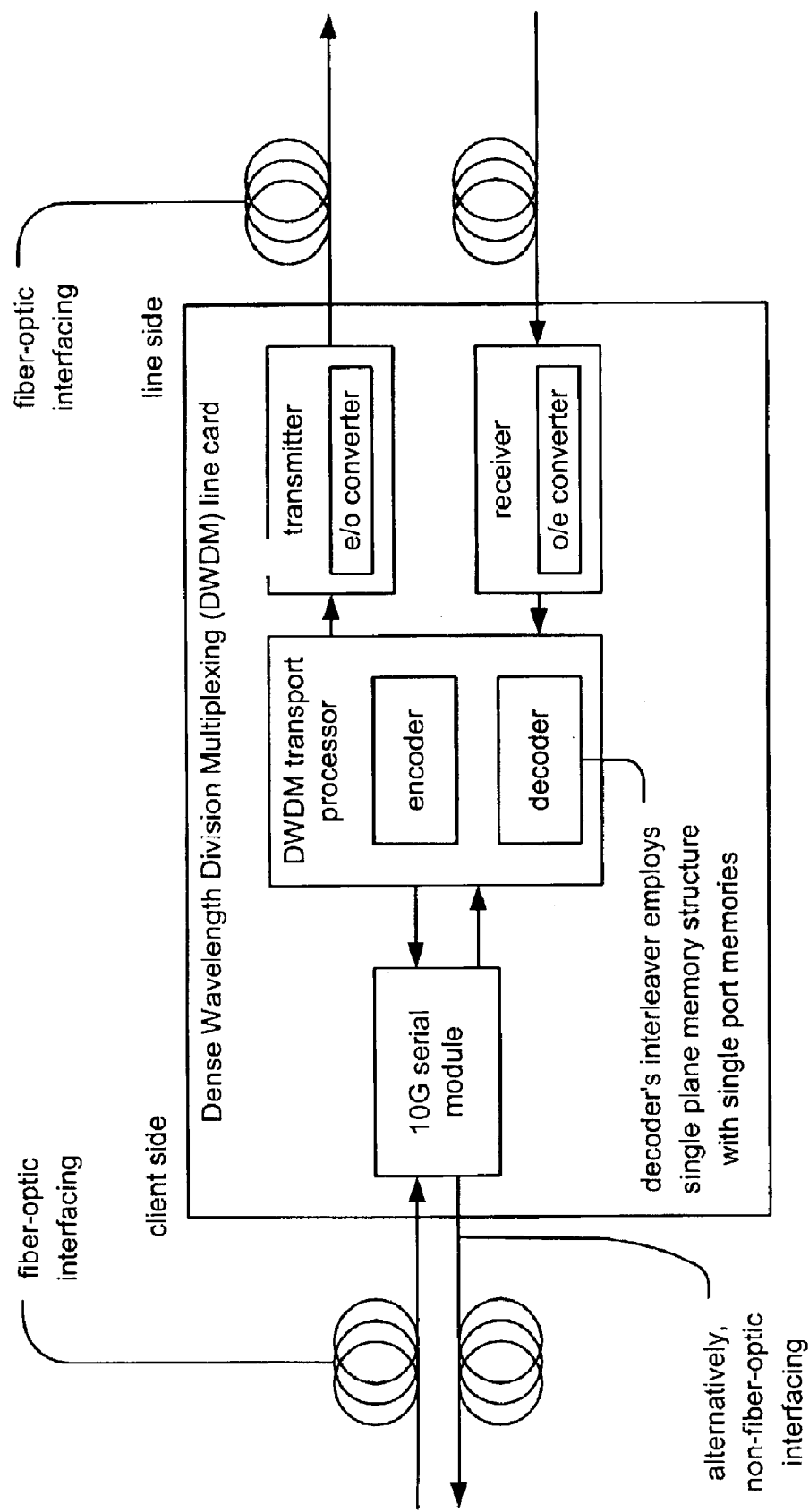
FIG. 8 is a system diagram illustrating an embodiment of a fiber-optic communication system that is built according to the invention.

FIG. 8 is a system diagram illustrating an embodiment of a fiber-optic communication system that is built according to the invention. The fiber-optic communication system is operable to support an iterative decoder design that uses the interleaving of the invention that employs single port memories. The FIG. 8 shows yet another embodiment of how the interleaving approach of the invention may be performed within a communication system.

The fiber-optic communication system includes a Dense Wavelength Division Multiplexing (DWDM) line card that is interposed between a line side and a client side. DWDM is a technology that has gained increasing interest recently. From both technical and economic perspectives, the ability to provide potentially unlimited transmission capacity is the most obvious advantage of DWDM technology. The current investment already made within fiber-optic infrastructure can not only be preserved when using DWDM, but it may even be optimized by a factor of at least 32 according to some estimates. As demands change, more capacity can be added, either by simple equipment upgrades or by increasing the number of wavelengths (lambdas) on the fiber-optic cabling itself, without expensive upgrades. Capacity can be obtained for the cost of the equipment, and existing fiber plant investment is retained. From the bandwidth perspective, some of the most compelling technical advantage of DWDM can be summarized as follows:

The transparency of DWDM: because DWDM is a physical layer architecture (PHY), it can transparently support both Time Division Multiplexing (TDM) and data formats such as asynchronous transfer mode (ATM), Gigabit Ethernet, ESCON, and Fibre Channel with open interfaces over a common physical layer.

The scalability of DWDM: DWDM can leverage the abundance of dark fiber (fiber-optic cabling installed but not yet being used) in many metropolitan area and enterprise networks to quickly meet demand for capacity on point-to-point links and on spans of existing SONET/SDH rings.

The dynamic provisioning capabilities of DWDM: the fast, simple, and dynamic provisioning of network connections give providers the ability to provide high-bandwidth services in days rather than months.

Fiber-optic interfacing is employed at each of the client and line sides of the DWDM line card. The DWDM line card includes a transport processor that includes functionality to support DWDM long haul transport, DWDM metro transport, next-generation SONET/SDH multiplexers, digital cross-connects, and fiber-optic terminators and test equipment. On the line side, the DWDM line card includes a transmitter, that is operable to perform electrical to optical conversion for interfacing to an optical medium, and a receiver, that is operable to perform optical to electrical conversion for interfacing from the optical medium. On the client side, the DWDM line card includes a 10G serial module. That is operable to communicate with any other devices on the client side of the fiber-optic communication system using a fiber-optic interface. Alternatively, the interface may be implemented using non-fiber-optic media, including copper cabling and/or some other type of interface medium.

The DWDM transport processor of the DWDM line card includes a decoder that is used to decode received signals from either one or both of the line and client sides and an encoder that is used to encode signals to be transmitted to either one or both of the line and client sides. The decoder may be implemented within the receiver to support the interleaving of the invention that employs single port memories.

Figure 9:
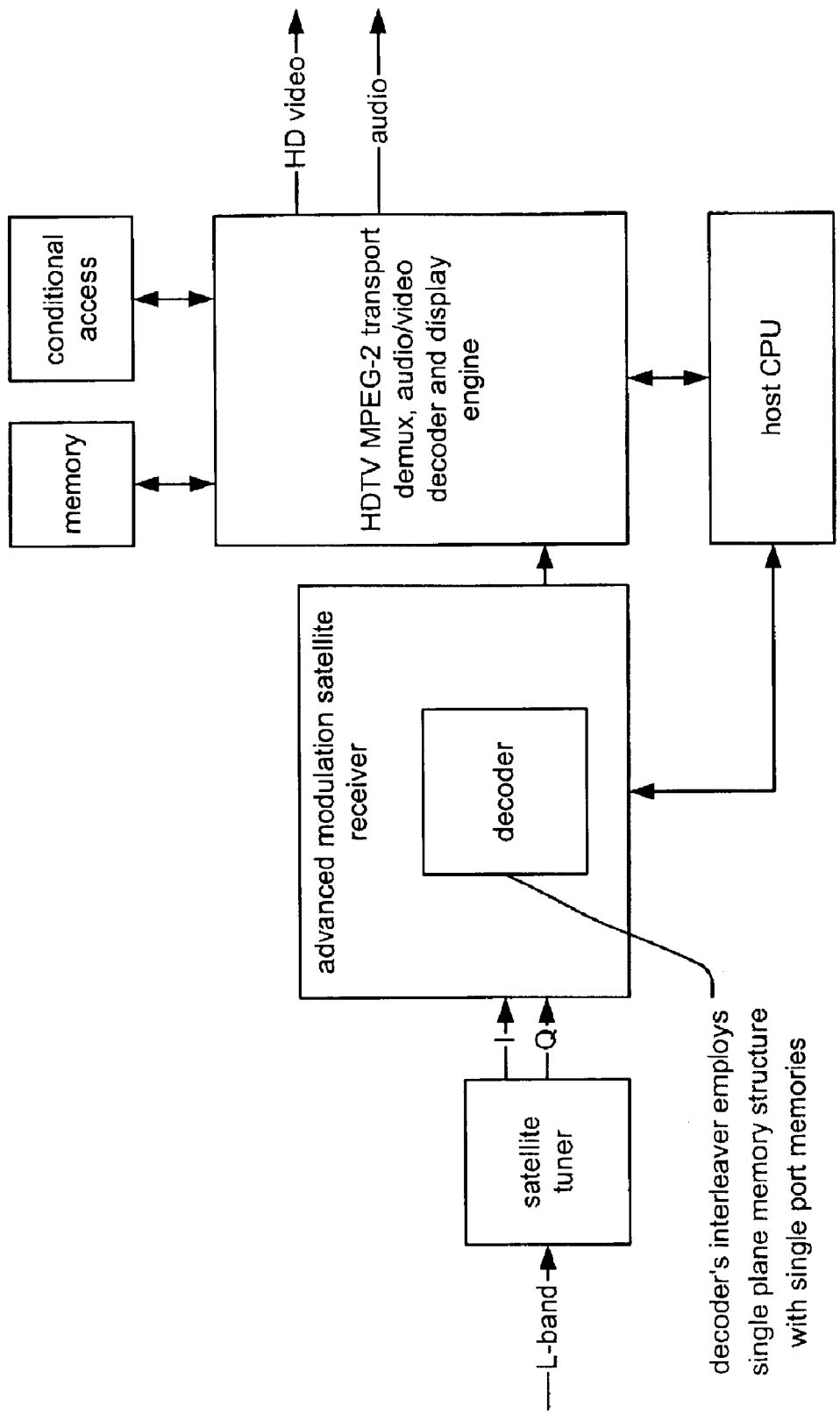
FIG. 9 is a system diagram illustrating an embodiment of a satellite receiver set-top box system that is built according to the invention.

FIG. 9 is a system diagram illustrating an embodiment of a satellite receiver set-top box system that is built according to the invention. The satellite receiver set-top box system includes an advanced modulation satellite receiver that is implemented in an all digital architecture. The satellite receiver set-top box system includes a satellite tuner that receives a signal via the L-band. The satellite tuner extracts I,Q (in-phase and quadrature) components from a signal received from the L-band and provides them to the advanced modulation satellite receiver. The advanced modulation satellite receiver includes an embodiment of the decoder that is operable to perform iterative decoding that may employ interleaving. The decoder may be implemented to support the interleaving of the invention that employs single port memories.

The advanced modulation satellite receiver communicatively couples to an HDTV MPEG-2 (Motion Picture Expert Group) transport de-mux, audio/video decoder and display engine. Both the advanced modulation satellite receiver and the HDTV MPEG-2 transport de-mux, audio/video decoder and display engine communicatively couple to a host Central Processing Unit (CPU). The HDTV MPEG-2 transport de-mux, audio/video decoder and display engine also communicatively couples to a memory module and a conditional access functional block. The HDTV MPEG-2 transport de-mux, audio/video decoder and display engine provides HD video and audio output that may be provided to an HDTV display.

The advanced modulation satellite receiver is a single-chip digital satellite receiver supporting the decoder that is operable to perform the interleaving of the invention that employs single port memories. The advanced modulation satellite receiver is operable to receive communication provided to it from a transmitter device that includes an encoder as well.

In addition, several of the following figures describe particular embodiments that may be used to implement the various embodiments of interleaving according to the invention that allows for the use of single port memories. The use of the inventions' approach to performing the interleaving allows for the use of single port memories thereby allowing many benefits thereof including reduced memory device size as well as lower cost. Using the approach provided by the invention, the use of the single port memory devices may be made to support the interleaving that is used during the iterative decoding processing while not deleteriously affecting performance. Very fast processing may still be achieved even with the use of single port memory devices when following the various aspects provided according to the invention.

Figure 10:
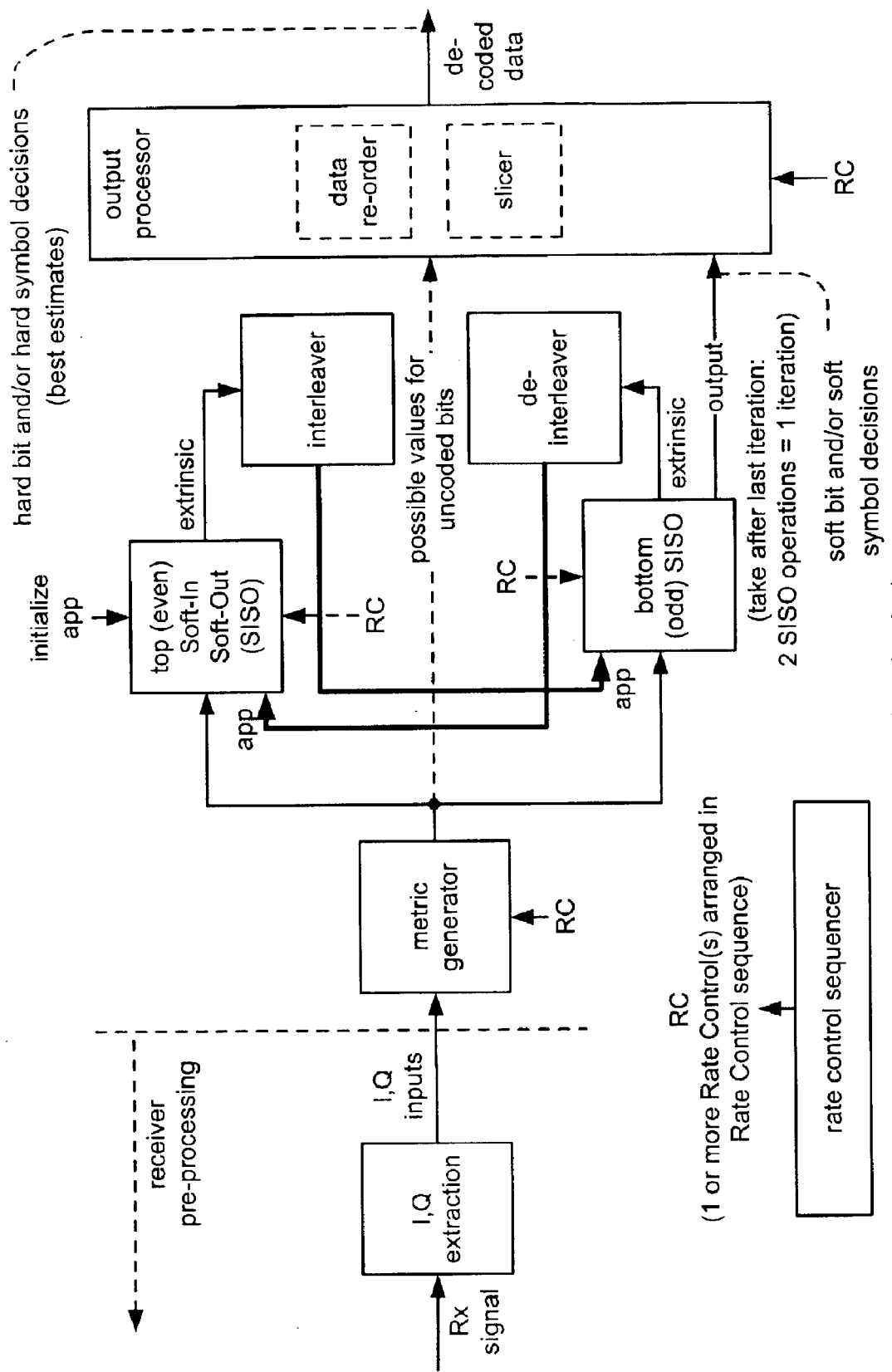
FIG. 10 is a diagram illustrating an embodiment of an iterative decoder design that is built according to the invention.

FIG. 10 is a diagram illustrating an embodiment of an iterative decoder design that is operable to employ the interleaving therein using the single port memories as described according to the invention. The efficient use of the single port memories reduces the total amount of hardware real estate required to implement the iterative decoder design.

A received signal is provided to an I,Q extraction functional block that extracts the I,Q (in-phase and quadrature) components from the received signal (shown as Rx signal) that are mapped according to a rate control (RC) as determined by a rate control sequencer.

While the rate control sequencer is operable to assist in the decoding of signals that may vary as a function of one or more parameters (including code rate, modulation, constellation type, and/or mapping), it is noted here that the interleaver memory processing according to the invention may also be performed within devices that operate on received signals that do not have such variability. The interleaver memory processing of the invention is capable to accommodate both decoding of non-variable signals (e.g., no varying code rate, modulation, constellation type, and/or mapping) as well as those signals whose parameters may vary as frequently as on a symbol by symbol basis. When viewing the various embodiments described herein that operate to decode a received signal based on one or more RCs, an embodiment that decodes non-variable signals may simply be viewed as one where all of the RCs have a common value. For example, the embodiments described herein that are capable of decoding variable signals may also be employed to decode non-variable signals simply by setting the RC to correspond with the parameters of the particular signal to be decoded.

Continuing on with the functional operation of this embodiment, the extraction of the I,Q components of the received signal may be viewed as being receiver pre-processing. The I,Q is then mapped according to the modulation's appropriate constellation and mapping. Then, the mapped I,Q is passed to a metric generator that also receives the RC input from the rate control sequencer. The metric generator generates the appropriate metrics that are measured from the received I,Q to the constellation points within the modulation's appropriate constellation and mapping; the metrics are indexed by the mapping of the constellation points within the modulation; these metrics may be viewed as being the scaled Euclidian distances from the location of the actual received symbol to the expected constellation point locations within the modulation.

The decoder is also operable to accommodate the decoding of uncoded bits as well (when they are employed). Thereafter, we then compare the metric associated with uncoded bit (for the situation where the uncoded bit u=0) with the metric associated with uncoded bit (for the situation where the uncoded bit u=1), and we select the smaller metric value. The smaller metric value is deemed a higher likelihood than the larger metric value according to this embodiment's convention; alternatively, in other embodiments, a larger metric value may be used to indicate a higher likelihood as being the correct value. We also select value of u based on which metric has the smaller value. We select the possible value of the uncoded bit u to be 1 or 0 as determined by which of the associated metrics has the smaller value (metric associated with uncoded bit (u=0) or the metric associated with uncoded bit (u=1)).

In certain embodiments, we may perform a min* operation that includes a logarithmic correction in selecting the smaller metric. Alternatively, we may perform a max* operation that includes a logarithmic correction in selecting the smaller metric. In even other embodiments, a simple min or max calculation may be employed. It is noted that the various embodiments of the invention may be implemented using the max* operations in lieu of the min* operation when preferred in a given implementation.

The min* calculation may be expressed as follows:

$$\min{}^*(A,B)=\min(A,B)-\ln(1+e^{-|A-B|})$$

The max* calculation may be expressed as follows:

$$\max{}^*(A,B)=\max(A,B)+\ln(1+e^{-|A-B|})$$

Either one of the min, max, min*, or max* operations may also employ a constant offset as desired to avoid the need to tracking a sign bit during calculation; 2s complement processing may be avoided by ensuring that the resultants of all calculations are all greater than zero or all less than zero.

Continuing on, as an example of this operation of decoding an uncoded bit, we will consider a received symbol, as determined by a particular RC, that is expected to have a form of $uc_2c_1c_0$, where u represents an uncoded bit, and the c's represent coded bits—all of a 4 bit symbol. We then set u=1 and then u=0 for every combination (looking at $c_2c_1c_0$= 111 as an example), so we deal with the two possible values for $uc_2c_1c_0$=0111 and $uc_2c_1c_0$=1111. We then compare the location of the received symbol, as mapped within the constellation, to the two constellation points indexed by 0111 and 1111. We then select from these two constellation points indexed by 0111 and 1111 based on which one has the smaller valued metric. So, in this RC example used here, we reduce the total number of 16 metrics down to 8. We then store these 8 metric values and 8 possible uncoded bit values (indexed by the metrics indices for each symbol in a received frame—a frame may also be referred to as a block), for subsequent use in decoding the uncoded bit after we have decoded the input bits, $i_0i_1$. After we perform decoding of the input bits, $i_0i_1$, then we will know with certainty what the bits $c_2c_1c_0$ are, and then we may directly determine the uncoded bit value u based on these 8 possible uncoded bit values that we have stored.

Continuing on with the decoding process and functionality within this figure, the metrics that are calculated by the metric generator are then provided to a top (even) SISO and simultaneously to a bottom (odd) SISO. Each of these SISOs calculates forward metrics (alphas) and backward metrics (betas), and extrinsic values according to the particular trellis employed. These alphas, betas, and extrinsics are all calculated for each symbol within a frame (a frame of data may sometimes be referred to as a block of data) that is to be decoded. These calculations of alphas, betas, and extrinsics are all based on the trellis and according to the RC provided by the RC input from the rate control sequencer.

Starting with the top SISO, after the extrinsic values have been calculated, they are passed to an interleaver after which they is passed to the bottom SISO as "a priori probability" (app) information. Similarly, after extrinsic values have been calculated within the bottom SISO, they are passed to a de-interleaver after which it is passed back to the top SISO as "a priori probability" (app) information.

The interleaver memory processing of the invention, that employs single port memories, is used to implement the interleaver and de-interleaver thereby consuming less hardware real estate within the device as well as reducing the cost of the device, namely, in the cost of the memory devices required. The interleaver functional block and the de-interleaver functional block are both implemented using the interleaver memory processing and memory partitioning according to the invention. For example, each of the entire interleaver memory and the entire interleaver pattern memory is broken into two separate memory portions that are each implemented using single port memory structures. One of the memory structures is employed for odd address locations, and another memory structure is employed for even address locations.

It is also noted that a single decoding iteration, within the iterative decoding process of the iterative decoder design consists of performing two SISO operations; that is to say, the iterative decoding process must pass through both the top (even) SISO and through the bottom (odd) SISO to perform one iteration of decoding.

After a significant level of confidence has been achieved and a solution is being converged upon, or after a predetermined number of decoding iterations have been performed, then the output from the bottom (odd) SISO is passed as output to an output processor. The output processor is operable to perform reordering of the data that is provided to it from the SISO as well as slicing of the received soft decisions. The slicer compares the received soft decision to a threshold and then makes a hard determination based on whether the soft decision value is above or below the threshold. The SISO will provide the data to the output processor in an order that is described in greater detail below. The operation of the SISOs may generally be referred to as calculating soft symbol decisions for the symbols contained within a received data frame (or data block). These soft symbol decisions may be performed on a true bit level in certain embodiments. The output processor uses these soft symbol decisions (and/or soft bit decisions) to generate hard symbol decisions (and/or hard bit decisions) for the input bits (e.g., say $i_0 i_1$ in a 2 bit input symbol embodiment) of the input symbol and to provide decoded output data; these hard symbol and/or hard bit decisions may be viewed as being best estimates of the input symbols and/or the input bits contained therein.

Moreover, in the situation where we have one or more uncoded bits u that results from the coding of the input bits, $i_0 i_1$, we then also need to use as many as 8 possible uncoded bit values (indexed by the metrics indices) according to the embodiment described above, so that we can directly determine the value of the uncoded bit.

It is also noted that the app sequence for the top (even) SISO must be initialized before beginning the iterative decoding. The notation for the app sequence app[i][j][k] is as follows:

1. i represents the possible binary value of the estimated bit
2. The positions of the estimated bit are denoted as follows: (j=0 refers the first bit into the encoder and j=1 refers the second bit into the encoder)
3. k is the index of the symbol's location within the data block (or frame).

More specifically, k represents the symbol index of the symbols in a frame of data, j is the bit index (j=0 for bit $i_1$ and j=1 for bit $i_0$), and i is the bit value (i=0 or 1). For example, app[1][0][50] represents the app for bit $i_1$ of the $50^{th}$ symbol being a value of 1.

At least two ways to initialize app[i][j][k] are described below:

1. app[i][j][k]=0.0,i,j∈{0,1},k ∈{0, . . . , N−1}. Each and every TTCM coding, using any of the possible combination of RCs for a rate control sequence may use this initialization.
2. The TTCM coding with RC sequence 8 can have different initialization defined as follows.

app[0][1][k]=0.0
app[1][1][k]=MAX, for all possible k.
app[0][0][k]=0.0

For the sequence app[0][0][k], we may first define the sequence based on the rate control sequence using the intermediate variable pP and pP* (which denotes the interleaved version of pP).

pP[1][0][k]=MAX for RC 8
pP[1][0][k]=0.0 otherwise

Then, we interleave this sequence with de-interleave $\pi^{-1}$ is employed to generate the sequence pP*[1][0][k]. Finally, we define the initial app[1][0][k] as follows:

app[1][0][k]=pP[1][0][k] if k mod2=0
app[1][0][k]=pP*[1][0][k] if k mod2=1

Moreover, by using the interleaving $\pi$, we can directly define the app[1][0][k] as follows:

app[1][0][k]=MAX if RC [$\hat{\pi}$(k)]=8
app[1][0][k]=0.0 otherwise

Further detail of the interleaver memory of the invention is provided below within several of the following figures. In addition, other decoder type embodiments that may employ the interleaver memory processing of the invention are also described.

Figure 11:
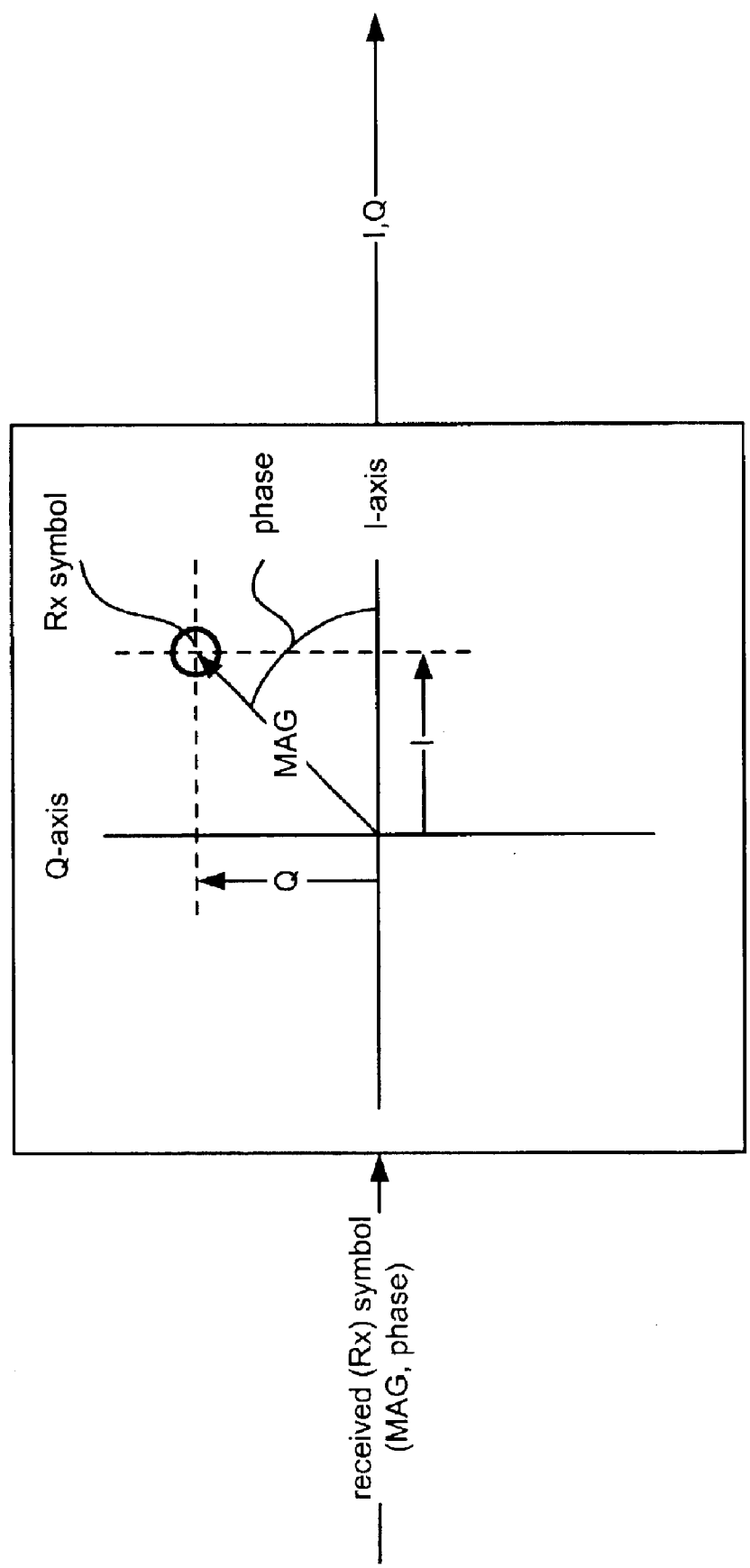
FIG. 11 is a diagram illustrating in-phase and quadrature (I,Q) signal extraction that is performed according to the invention.

FIG. 11 is a diagram illustrating in-phase and quadrature (I,Q) signal extraction that is performed according to the invention. A received symbol, having a magnitude and phase is provided to an I,Q extraction block. This symbol (or signal) is mapped in a two dimensional space such that an in-phase and a quadrature component may be extracted. This in-phase measurement and the quadrature component are provided as output from the I,Q extraction functional block. The I,Q components of the received signal may be viewed as being the baseband (BB) component of the signal.

Figure 12:
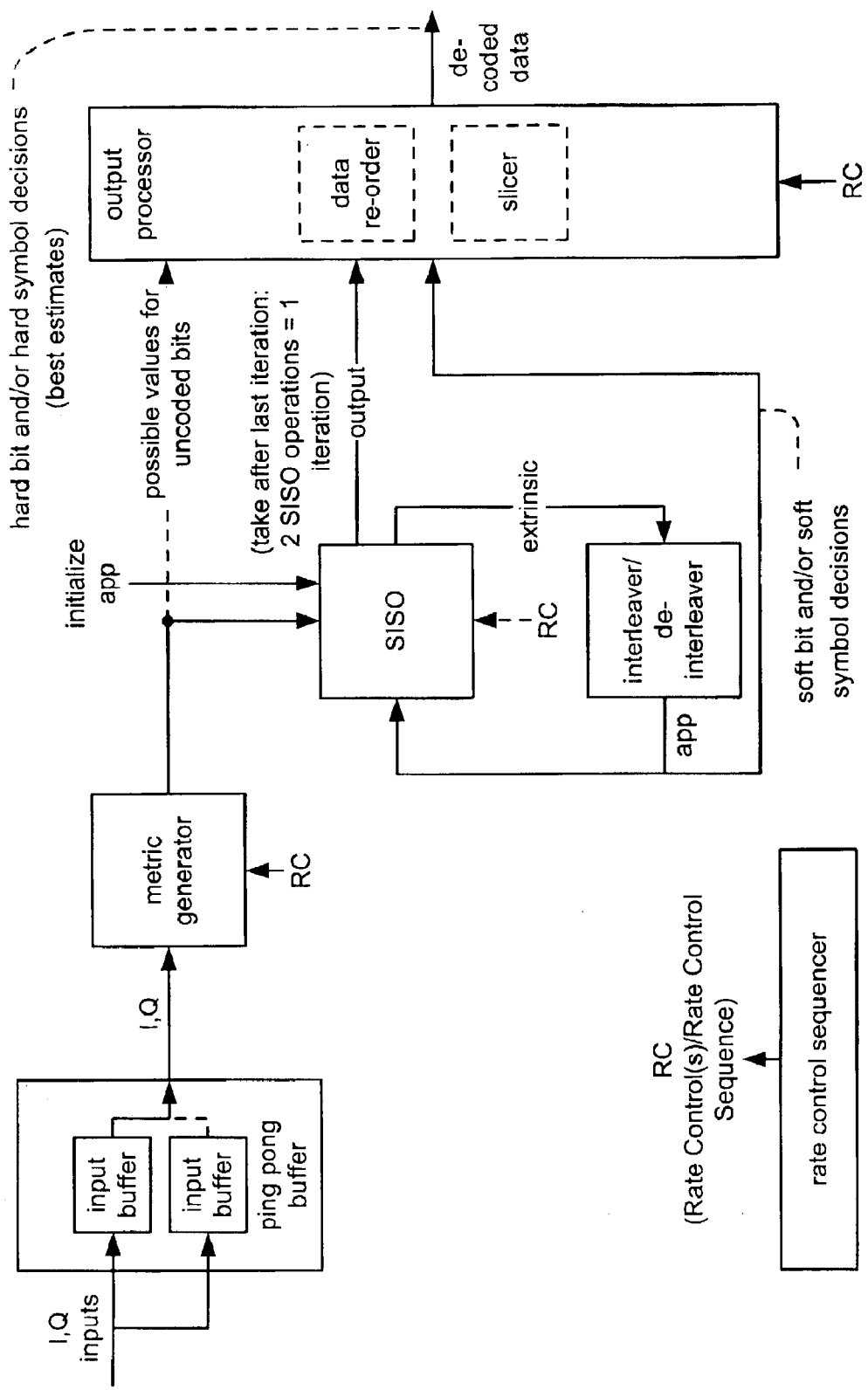
FIG. 12 is a diagram illustrating an alternative embodiment of an iterative decoder design that is built according to the invention that recycles a single SISO (soft-in soft-out functional block).

FIG. 12 is a diagram illustrating an alternative embodiment of an iterative decoder design that is built according to the invention that recycles a single SISO (soft-in soft-out functional block). This single SISO will perform the functionality of the top (even) SISO as well as the bottom (odd) SISO, depending on which SISO operation is being performed during the decoding iteration, as described above in a somewhat related embodiment. This alternative iterative decoder design receives as input the I,Q from a received signal. Similar to embodiments described above, an I,Q extraction functional block may also be employed to extract these I,Q inputs as well when performing receiver pre-processing. A ping pong buffer, employing two input buffers, may be employed for efficient buffering of the I,Q inputs. The I,Q inputs are then passed to the metric generator.

The output of the metric generator is passed to the single SISO; the information necessary to perform decoding of any possible uncoded bits will be passed to the output processor. The SISO calculates forward metrics (alphas), backward metrics (betas), and extrinsic values (exts) according to the trellis employed and provides them to a functional block that is operable to perform both interleaving and de-interleaving (depending upon which particular SISO operation is being performed within the given decoding iteration). The output of the interleaver/de-interleaver functional block is passed back to the SISO as app within a given SISO operation.

The interleaver/de-interleaver functional block is implemented using the interleaver memory processing and memory partitioning according to the invention. For example, each of the entire interleaver memory and the entire interleaver pattern memory is broken into two separate memory portions that are each implemented using single port memory structures. One of the memory structures is employed for odd address locations, and another memory structure is employed for even address locations.

Similar to the embodiment described above, it is noted that a single decoding iteration, within the iterative decoding process of the alternative iterative decoder design consists of performing two SISO operations; that is to say, the iterative decoding process must pass through both the SISO once (when the SISO performs the top SISO functionality) and through the SISO again (when the SISO performs the bottom SISO functionality).

After a significant level of confidence for the soft symbol decisions within the SISO have been achieved and a solution is being converged upon, or after a predetermined number of decoding iterations have been performed, then the output from the SISO is passed as output to the output processor. These soft symbol decisions may also be performed on a true bit level in certain embodiments. The output processor uses these soft symbol decisions to generate hard symbol decisions and to provide decoded output data. It is also noted that a similar app initialization may be performed here as within the embodiment described above.

Figure 13A:
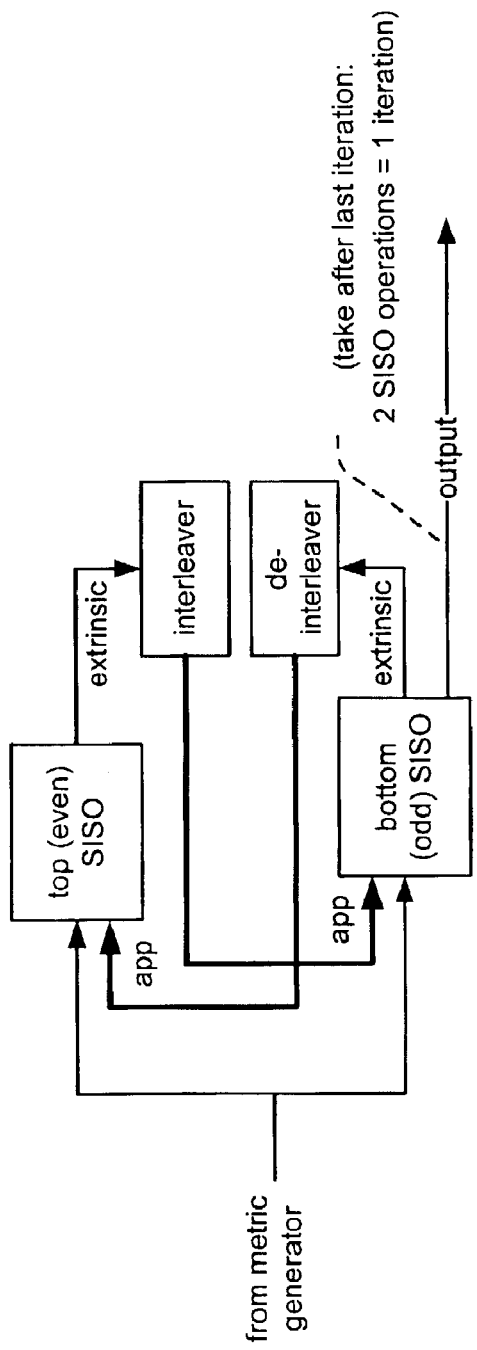
FIG. 13A is a diagram illustrating an embodiment of an iterative SISO decoder design (having top and bottom SISOs) with separate interleaver and de-interleaver functional blocks.

FIG. 13A is a diagram illustrating an embodiment of an iterative SISO decoder design (having top and bottom SISOs) with separate interleaver and de-interleaver functional blocks. This embodiment shows the implementation of two SISO iterative decoders that employ two separate functional blocks for performing interleaving and de-interleaving that capitalize on the interleaver memory processing provided by the invention.

The operation of this embodiment is analogous to the respective components described above in the analogous embodiment. For example, in the iterative decoding processing, the interleavers are required to exchange extrinsic information between two SISO decoders. This figure indicates that extrinsic information from the top SISO goes into the bottom SISO in the interleaved order and extrinsic information from bottom SISO goes into the top SISO in the de-interleaved order. The interleaver memory accesses may be performed in one of two ways as described below in FIGS. 14A and 14B.

Figure 13B:
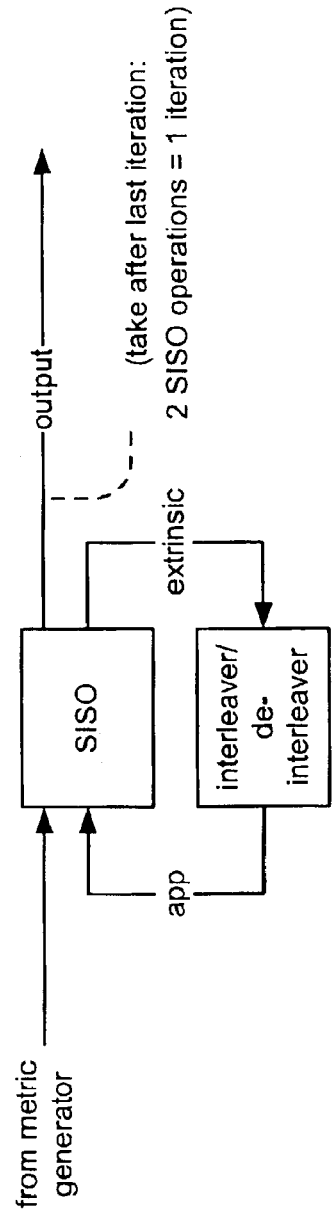
FIG. 13B is a diagram illustrating an embodiment of an iterative single, recycled SISO decoder design (having a single SISO) with a single interleaver/de-interleaver functional block.

FIG. 13B is a diagram illustrating an embodiment of an iterative single, recycled SISO decoder design (having a single SISO) with a single interleaver/de-interleaver functional block. This embodiment shows the implementation of a single SISO iterative decoder that employs a single functional block for performing both the interleaving and de-interleaving operations such that the interleaver/de-interleaver capitalizes on the interleaver memory processing provided by the invention.

Again, the operation of this embodiment is analogous to the respective components described above in the analogous embodiment. For example, in the iterative decoding processing, the interleaver/de-interleaver is required to exchange extrinsic information between itself and the SISO decoder (appropriately depending on which SISO operation is being performed within a given decoding iteration). Analogously, extrinsic information from the SISO is fed back into the SISO in the interleaved order (during one SISO operation within decoding iteration) and extrinsic information is fed back into the SISO in the de-interleaved order (during the other SISO operation within decoding iteration). These interleaver/de-interleaver memory accesses may be performed in one of two ways as described below in FIGS. 14A and 14B.

Within each of the FIGS. 14A and 14B, the reference to a top SISO and a bottom SISO is used, yet it is understood that, even within the single SISO embodiments, these references will refer to the respective/corresponding SISO operations within a decoding iteration. The read/write operations described here will ensure the proper passage of extrinsic information (being appropriately interleaved or de-interleaved) between the two SISO decoders.

FIG. 14A is a diagram illustrating an embodiment of read/write operations performed by an interleaver/de-interleaver memory according to the invention. During a first decoding iteration, the top SISO operation will be accompanied with no extrinsic information read access and a sequential extrinsic write access. During the first decoding iteration, the bottom SISO operation will be accompanied with an interleaved extrinsic information read access and a sequential extrinsic write access.

A second decoding iteration may be described as follows: the top SISO operation will be accompanied with a de-interleaved extrinsic information read access and a sequential extrinsic write access. During the second decoding iteration, the bottom SISO operation will be accompanied with an interleaved extrinsic information read access and a sequential extrinsic write access.

Subsequent decoding iterations may also be performed in accordance with this processing, as required in the given embodiment, to complete the soft symbol decision making to a sufficient degree of accuracy.

While this read/write operations shown here in the FIG. 14A are operable, both the interleaver pattern and the de-interleaver pattern are required if this scheme is to be used. In general, the read/write operations scheme described below with respect to FIG. 14B may be used to avoid this problem.

FIG. 14B is a diagram illustrating another, more efficient embodiment of read/write operations performed by an interleaver/de-interleaver memory according to the invention. During a first decoding iteration, the top SISO operation will be accompanied with no extrinsic information read access and a de-interleaved extrinsic write access. During the first decoding iteration, the bottom SISO operation will be accompanied with a sequential extrinsic information read access and also with a sequential extrinsic write access.

A second decoding iteration may be described as follows: the top SISO operation will be accompanied with a de-interleaved extrinsic information read access and also a de-interleaved extrinsic write access. During the second decoding iteration, the bottom SISO operation will be accompanied with a sequential extrinsic information read access and also with a sequential extrinsic write access.

Again, subsequent decoding iterations may also be performed in accordance with this processing, as required in the given embodiment, to complete the soft symbol decision making to a sufficient degree of accuracy.

It is noted that, using the read/write operations described with respect to FIG. 14B, the iterative decoder may be implemented only with the de-interleaver patterns. This provides an even more efficient manner in which to perform the iterative decoder can be implemented only with the de-interleaver patterns required to perform the decoding.

Moreover, since SISO decoder has some inherent latency, the extrinsic information that got stored in a certain location in the previous decoding has been already read out when the SISO decoder writes the extrinsic information in the current decoding into the same location. Therefore, there will be no need to use a ping-pong (or double plane) memory structure for the interleaver memory in this case. In addition, for low speed decoders, the read access and the write access operations may be performed during different clock cycles. However, this is not the case for decoders seeking to operate at very high operational speeds. For high speed decoders, which are the more desirable type of decoders to be used in iterative decoding processing, dual port memories must be used to make simultaneous read access and write access possible. On one hand, the use of these dual port memories is necessitated to provide for high speed decoding processing; on the other hand, their use inherently presents some inefficiency. For example, if dual port memories are used, the real estate area of the hardware will be almost doubled compared using single port counterparts. Therefore, no actual advantage will then be obtained by not using a ping-pong (or double plane) type memory structure for the interleaver memory. Certain aspects of the invention may be characterized as solving the problem of having to use dual port memories within high speed decoders. The invention provides a solution that high speed decoding operations may still be supported without requiring the need for dual port memories. Single port memories may be employed for interleaver processing while still maintaining very high speed decoding processing.

Figure 15:
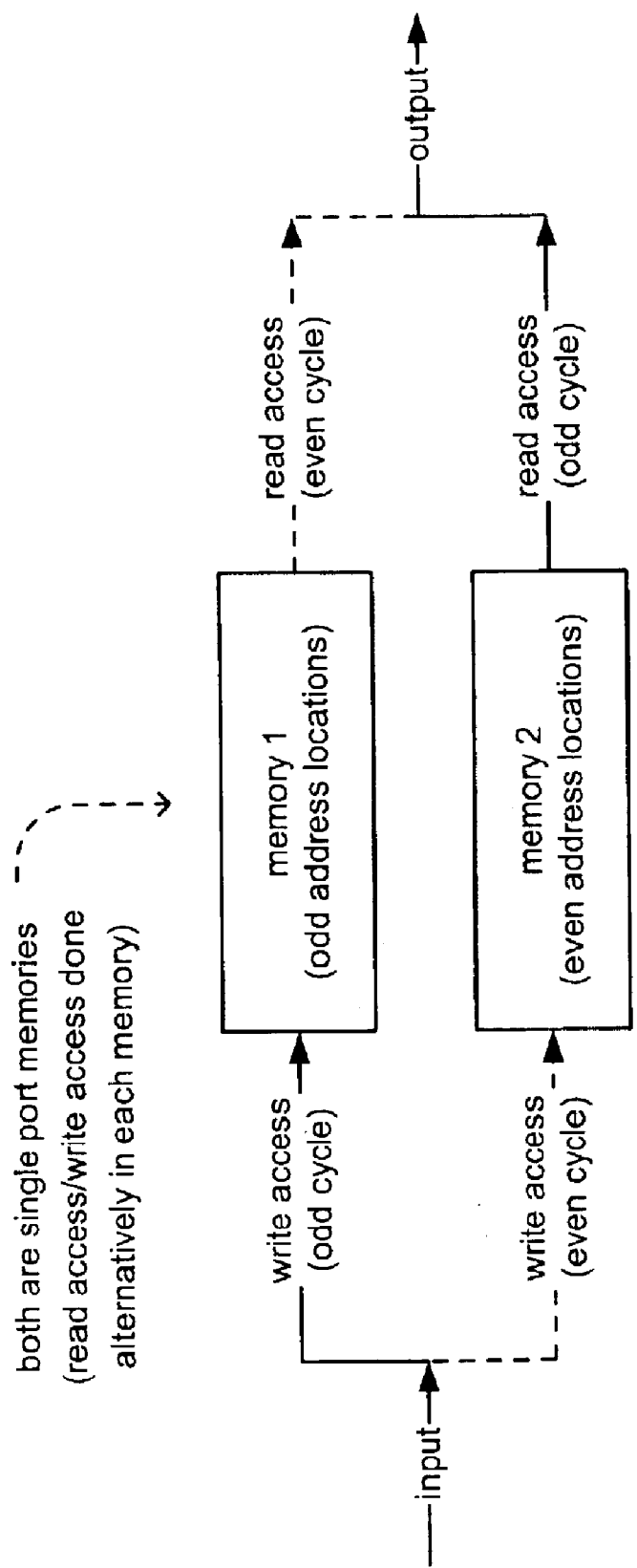
FIG. 15 is a diagram illustrating an embodiment of memory partitioning using single port devices according to the invention.

FIG. 15 is a diagram illustrating an embodiment of memory partitioning using single port devices according to the invention. This embodiment shows the use of two separate single port memory devices that are accessed alternatively. For example, input is provided to both memory 1 and memory 2. However, depending on which cycle is being performed (even or odd in the notation of this embodiment), one of the memories performs a read access and the other memory performs a write access. Again, it is noted that both of these memories are single port memories that are capable of performing one access at a time (be it a read access or a write access). In addition, each of the memories is dedicated to deal with either odd address locations or even address locations. For example, when memory 1 is dedicated for use with odd address locations, then the memory 2 is dedicated for use with even address locations (or vice versa).

Specifically within this embodiment, the memory 1 deals with odd address locations, and the memory 2 deals with even address locations. During an even cycle, the memory 2 performs a write access thereto and the memory 1 performs a read access thereto (if information has yet been placed there to be read). Thereafter, during an odd cycle, the memory 1 performs a write access thereto and the memory 2 performs a read access thereto (again, if information has yet been placed there to be read).

Figure 16:
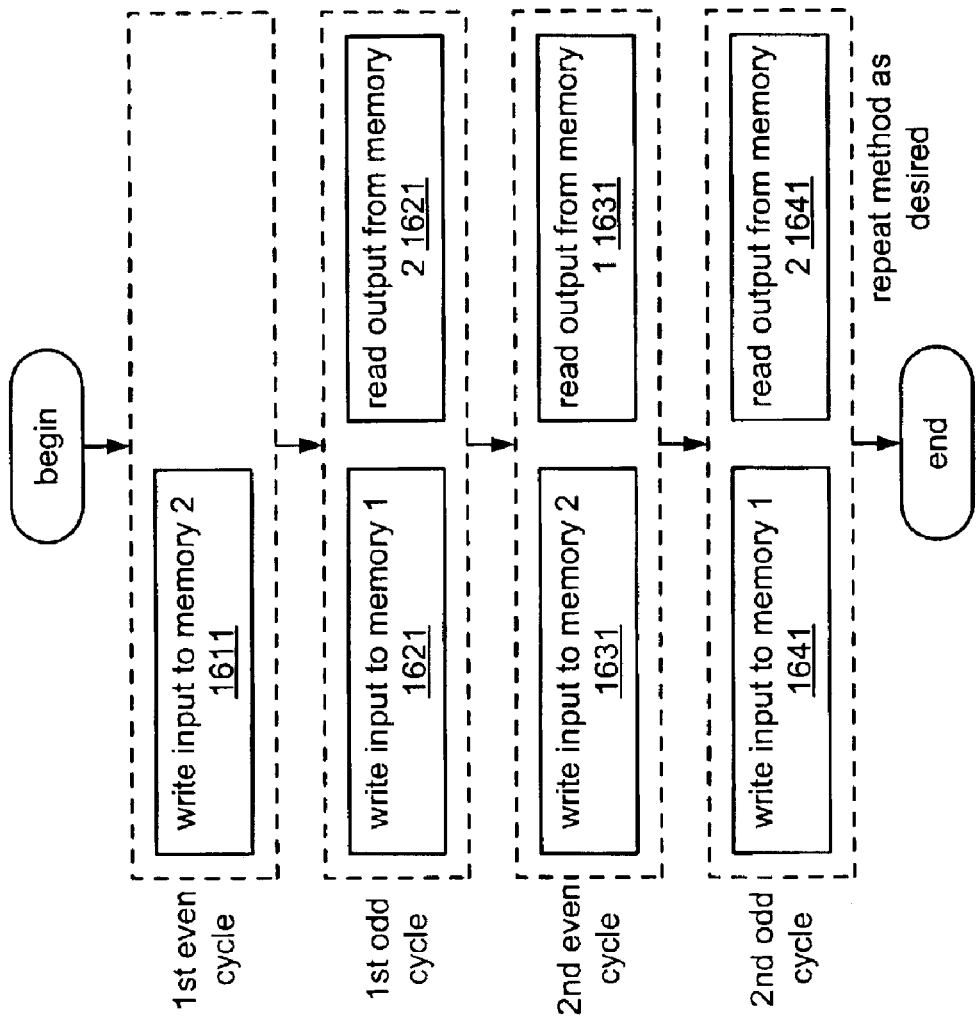
FIG. 16 is a flowchart illustrating an embodiment of an alternating read/write processing method, using single port memories, that is performed according to the invention.

FIG. 16 is a flowchart illustrating an embodiment of an alternating read/write processing method, using single port memories, that is performed according to the invention. Four (4) successive clock cycles are shown within this method; they are a $1^{st}$ even cycle ($1^{st}$ clock cycle), a $1^{st}$ odd cycle ($2^{nd}$ clock cycle), a $2^{nd}$ even cycle ($3^{rd}$ clock cycle), and a $2^{nd}$ odd cycle ($4^{th}$ clock cycle). Clearly, this processing may continue on to perform subsequent processing as well without departing from the scope and spirit of the invention.

During a first even cycle, as shown in a block 1611, input is written to a memory 2. Then, during a first odd cycle, as shown in a block 1621, input is written to a memory 1 as output is simultaneously read from memory 2 as shown in a block 1621.

The process then alternates for subsequent successive cycles. During a second even cycle, as shown in a block 1631, input is written to a memory 2 as output is simultaneously read from memory 1 as shown in a block 1631. Then, during a second odd cycle, as shown in a block 1641, input is written to a memory 1 as output is simultaneously read from memory 2 as shown in a block 1641.

This alternating reading and writing of data and output to and from the memory 1 and the memory 2 may be successively and alternatively performed using the single port memories.

Figure 17:
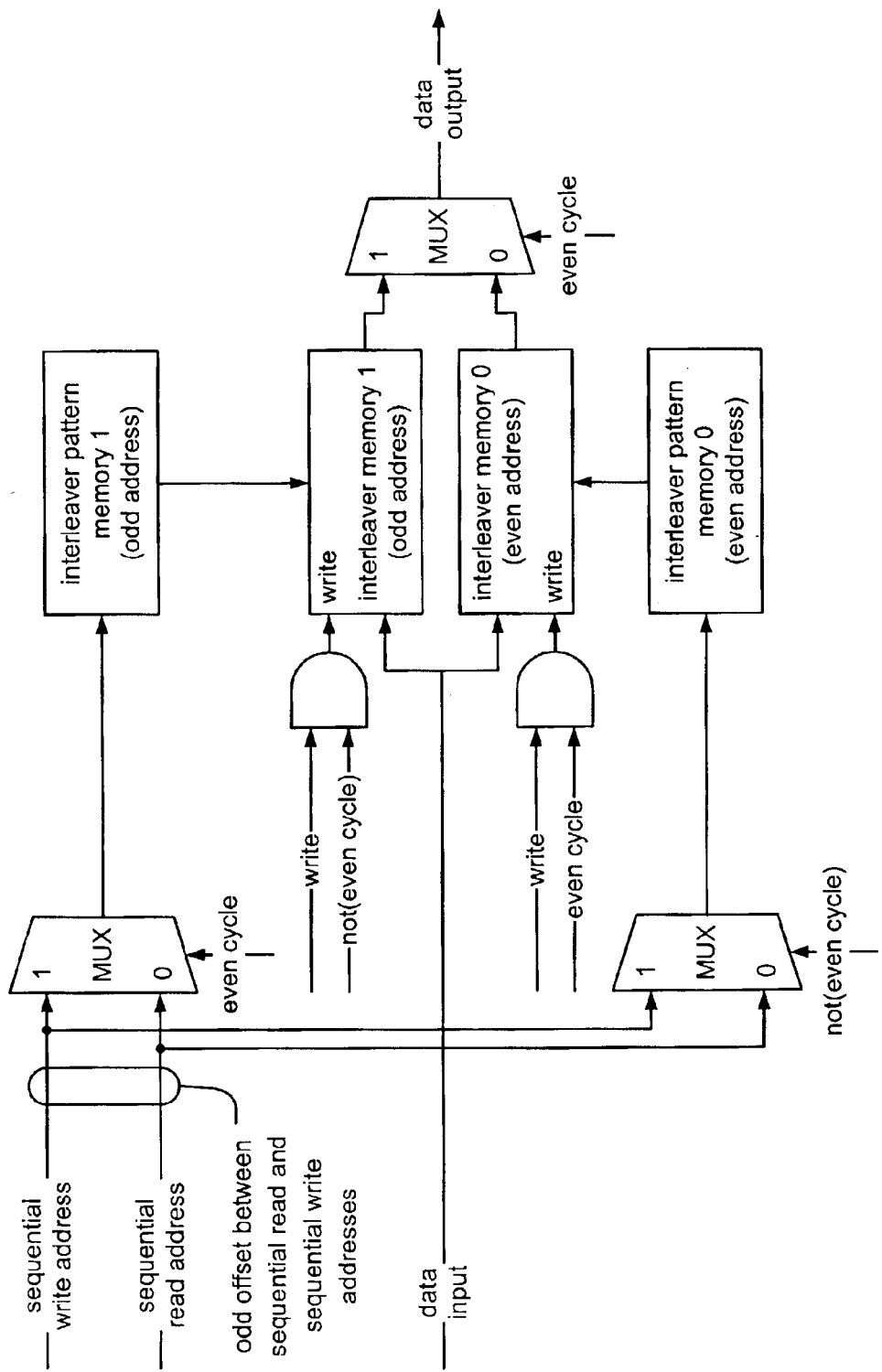
FIG. 17 is a diagram illustrating an embodiment of memory block partitioning for an interleaver of an iterative decoder according to the invention.

FIG. 17 is a diagram illustrating an embodiment of memory block partitioning for an interleaver of an iterative decoder according to the invention. As shown within this embodiment, the entire interleaver memory and the entire interleaver pattern memory are broken into two pieces: one for odd address locations (interleaver pattern memory 1 and interleaver memory 1) and another one for even address locations (interleaver pattern memory 0 and interleaver memory 0).

It is noted here that an odd offset is employed between the sequential read address and the sequential even address. In addition, the interleaver memory processing described herein is supported when the following condition is met: odd addresses are mapped to odd addresses in the interleaving pattern memories and even addresses are mapped to even addresses in the interleaving pattern memories. The coding scheme described herein satisfies this condition.

Generally, when a read access is made at an odd address in one of the interleaver memories, a write access is simultaneously made at even address in the other of the interleaver memories, and vice versa. In other words, the read accesses and the write accesses are performed alternatively in each of the interleaver memories. Expensive dual port memories are not required, and the interleaver pattern memory size is cut in half using this scheme.

As referenced above, the entire interleaver memory is broken into two pieces: one for odd address locations (interleaver memory 1) and another one for even address locations (interleaver memory 0). The entire interleaver pattern memory is also broken into two pieces: one for odd address locations (interleaver pattern memory 1) and another one for even address locations (interleaver pattern memory 0). The offset between sequential read address and sequential write address is also chosen to be an odd number.

Two 2 to 1 multiplexors (MUXes) are employed to perform the alternative operations of providing the sequential read addresses and the sequential write addresses to the interleaver patter memory 1 (used for odd addresses) and the interleaver pattern memory 0 (used for even addresses). The alternative selection of the sequential read addresses and the sequential write addresses is made using the selection provided by the clock, namely, when the clock has an even cycle. For example, when the clock is at an even cycle, then a sequential read address is provided to the interleaver pattern memory 0 and a sequential write address is provided to the interleaver pattern memory 1, or vice versa (depending on exactly how it is implemented—which value is associated with even cycle in the 2 to 1 MUXes [be it 1 or 0] and which value is associated with not[even cycle]—this may also be referred as an inverted clock cycle).

As for the alternative operation of writing the data input to the interleaver memory 1 (used for odd addresses) and the interleaver memory 0 (used for even addresses), two separate AND gates are communicatively coupled to those respective interleaver memories and, based on the particular clock cycle at hand (again, be it an even cycle or a not [even cycle], which may be viewed as an odd cycle), the data input will alternatively be provided to the interleaver memory 1 (used for odd addresses) and the interleaver memory 0 (used for even addresses).

Ultimately in this embodiment, an output 2 to 1 MUX is used to alternatively select output that is read from the interleaver memory 1 (used for odd addresses) and the interleaver memory 0 (used for even addresses). The ultimate data output will then be output according to the appropriate interleaving pattern that is implemented using the two separate single port memory structures shown as the interleaver pattern memory 1 (used for odd addresses) and the interleaver pattern memory 0 (used for even addresses).

This embodiment shows how appropriate partitioning of the interleaver pattern memory (into 2 distinct single port memory structures) and the appropriate partitioning of the interleaver memory itself (also into 2 distinct single port memory structures), coupled with some simple multiplexing and logic circuitry (2 AND gates in this embodiment).

Figure 18:
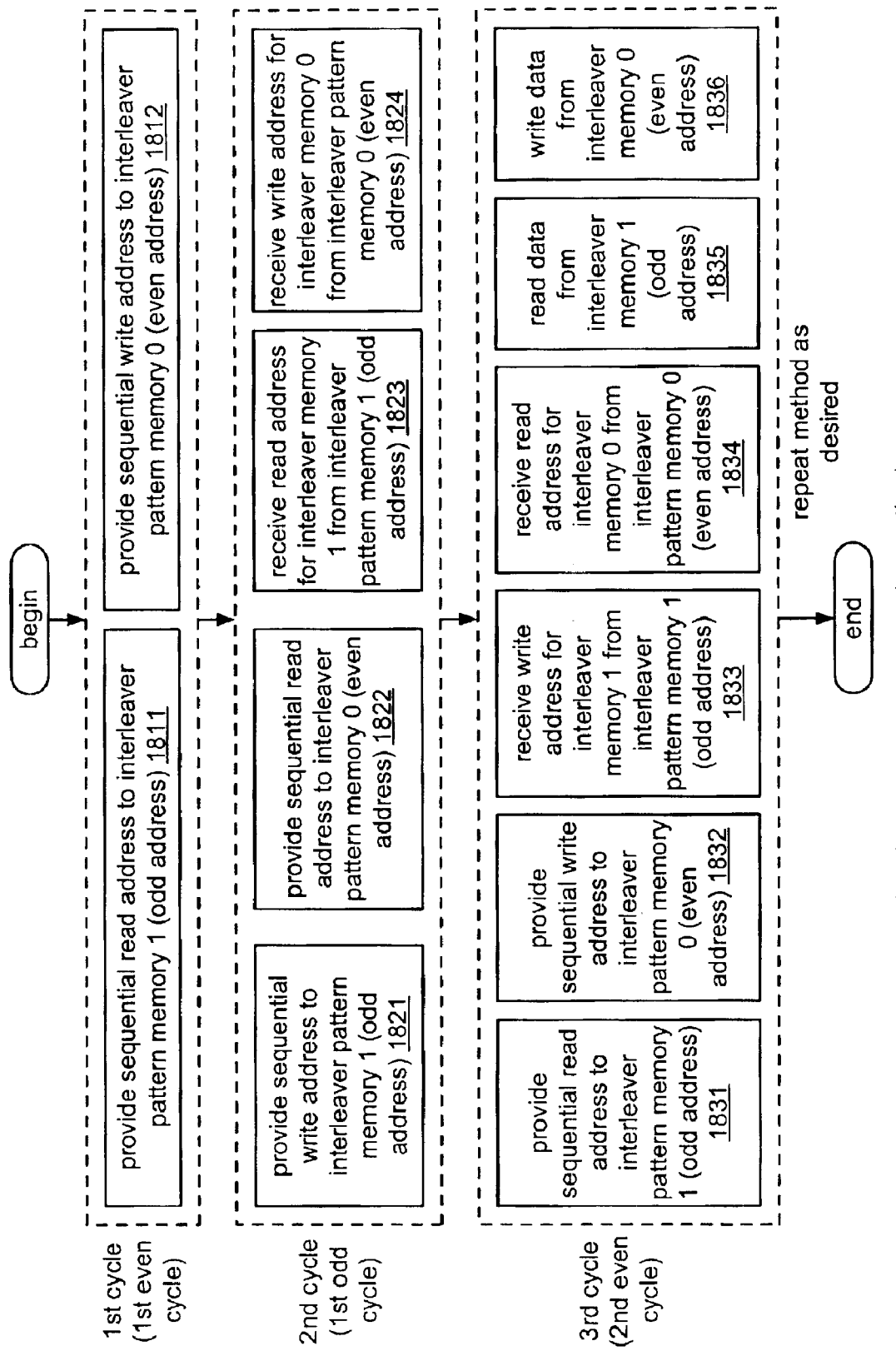
FIG. 18 is a flowchart illustrating an embodiment of an interleaver memory processing method that is performed according to the invention

FIG. 18 is a flowchart illustrating an embodiment of an interleaver memory processing method that is performed according to the invention. Three (3) successive clock cycles are shown within this method; they are a $1^{st}$ even cycle ($1^{st}$ clock cycle), a $1^{st}$ odd cycle ($2^{nd}$ clock cycle), and a $2^{nd}$ even cycle ($3^{rd}$ clock cycle). Clearly, this processing may continue on to perform subsequent processing as well without departing from the scope and spirit of the invention.

During a $1^{st}$ even cycle ($1^{st}$ clock cycle), a sequential read address is provided to interleaver pattern memory 1 (odd address) as shown in a block 1811. Also simultaneously during this cycle, a sequential write address is provided to interleaver pattern memory 0 (even address) as shown in a block 1812.

During a $1^{st}$ odd cycle ($2^{nd}$ clock cycle), four operations are simultaneously performed. A sequential write address is provided to interleaver pattern memory 1 (odd address) as shown in a block 1821. Also simultaneously during this cycle, a sequential read address is provided to interleaver pattern memory 0 (even address) as shown in a block 1822. A read address for interleaver memory 1 is received from interleaver pattern memory 1 (odd address) as shown in a block 1823, and a write address for interleaver memory 0 is received from interleaver pattern memory 0 (even address) 1824.

During a $2^{nd}$ even cycle ($3^{rd}$ clock cycle), six operations are simultaneously performed. A sequential read address is provided to interleaver pattern memory 1 (odd address) as shown in a block 1831. Also, a sequential write address is provided to interleaver pattern memory 0 (even address) as shown in a block 1832. A write address for interleaver memory 1 is received from interleaver pattern memory 1 (odd address) as shown in a block 1833, and a read address for interleaver memory 0 is received from interleaver pattern memory 0 (even address) 1834. Also, data is read from interleaver memory 1 (odd address) as shown in a block 1835, and data is written from interleaver memory 0 (even address) as shown in a block 1836.

This method shows the alternative nature of how single write or read accesses may be made to each of the various single port memory structures within a communication device that is implemented to perform interleaving according to the invention.

Figure 19:
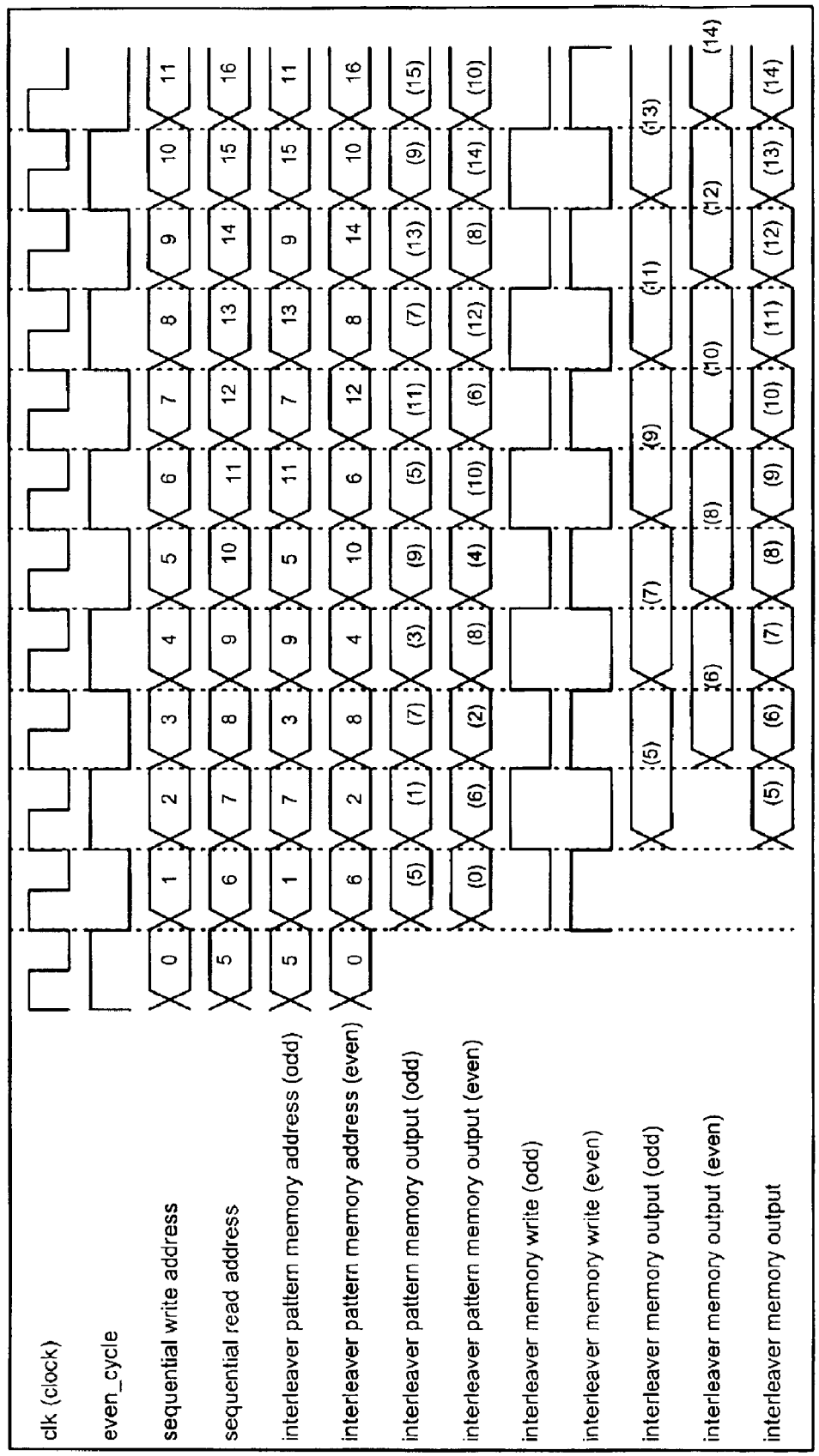
FIG. 19 is a diagram illustrating an embodiment of an interleaver memory timing chart that shows the relative operational flow of data according to the invention.

FIG. 19 is a diagram illustrating an embodiment of an interleaver memory timing chart that shows the relative operational flow of data according to the invention. A clock signal (clk) is provided as shown at the top of the timing chart. An even cycle (even_cycle) of the clock is shown as being at a high value every other clock cycle. In between the high values of the even_cycle may be viewed as being odd cycles.

The sequential write addresses and the sequential read addresses may be seen as having an odd offset between them in this embodiment (5 cycles). For each of the interleaver pattern memory (odd) and the interleaver pattern memory (even), it can be seen that they alternatively select between the current values of the sequential write address and the sequential read address every clock cycle. Subsequently, is can also be seen that the values that are output from the interleaver memory (odd) and the interleaver memory (even) directly follow the interleaving pattern provided by the interleaver pattern memory (odd) and the interleaver pattern memory (even), being delayed by one clock cycle. The interleaver memory write (odd) and the interleaver memory write (even) processes alternate every other clock cycle as well.

The interleaver memory output may be seen as alternatively selecting between the data stored within the interleaver memory output (odd) and the data stored within the interleaver memory output (even) every clock cycle even though each of the interleaver memory output (odd) and the interleaver memory output (even) alternates every other clock cycle (every 2 cycles). The operations shown here in this timing chart show how the alternative nature of processing the data allows for the use of single port memory structures when performing the interleaving processing involved in performing iterative decoding.

The invention provides a number of advantages over the prior art approaches of trying to perform interleaver memory processing. For example, in the prior art, the ping-pong structure or dual port memories are used in efforts to perform high speed decoding processing. In contradistinction, the invention performs the interleaver memory processing using a single plane memory structure with single port memories. By doing this, the invention provides many benefits including the fact that both the interleaver memory size and the interleaver pattern memory size are cut in half. Moreover, since each interleaver memory is read every other clock cycle, relatively cheaper and slower memories may be used for the interleaver memory processing with the simple addition of a pipeline stage before the final output selector.

In view of the above detailed description of the invention and associated drawings, other modifications and variations will now become apparent. It should also be apparent that such other modifications and variations may be effected without departing from the spirit and scope of the invention.

What is claimed is:

1. An interleaver memory structure for facilitating the decoding of a plurality of encoded symbols, the interleaver memory structure comprising:
   during a first clock cycle:
      a first interleaver pattern memory receives a first sequential read address;
      a second interleaver pattern memory receives a first sequential write address;
   during a second clock cycle:
      the first interleaver pattern memory receives a second sequential write address;
      the second interleaver pattern memory receives a second sequential read address;
      a first read address is received from the first interleaver pattern memory for use by a first interleaver memory;
      a first write address is received from the second interleaver pattern memory for use by a second interleaver memory;
   during a third clock cycle:
      the first interleaver pattern memory receives a third sequential read address;
      the second interleaver pattern memory receives a third sequential write address;
      a second write address is received from the first interleaver pattern memory for use by the first interleaver memory;
      a second read address is received from the second interleaver pattern memory for use by the second interleaver memory;
      a first data is read from the first interleaver memory;
      a second data is written to the second interleaver memory; and
      wherein each of the first interleaver pattern memory, the second interleaver pattern memory, the first interleaver memory, and the second interleaver memory are implemented using single port memory structures.

2. The interleaver memory structure of claim 1, wherein:
   during a fourth clock cycle:
      the first interleaver pattern memory receives a fourth sequential write address;
      the second interleaver pattern memory receives a fourth sequential read address;
      a third read address is received from the first interleaver pattern memory for use by the first interleaver memory;
      a third write address is received from the second interleaver pattern memory for use by the second interleaver memory;
      a third data is written to the first interleaver memory; and a fourth data is read from the second interleaver memory.

3. The interleaver memory structure of claim 1, wherein read accesses and write accesses are alternatively performed within each of the first interleaver memory and the second interleaver memory.

4. The interleaver memory structure of claim 1, wherein the first sequential read address and the first sequential write address are offset by an odd value.

5. The interleaver memory structure of claim 1, wherein the second sequential write address and the second sequential write address are offset by an odd value.

6. The interleaver memory structure of claim 1, further comprising:
- a first multiplexor (MUX) that receives the first sequential read address and the first sequential write address as inputs during the first clock cycle and provides the first sequential read address to the first interleaver pattern memory;
- a second MUX that receives the first sequential read address and the first sequential write address as inputs during the first clock cycle and provides the first sequential write address to the second interleaver pattern memory;
- wherein the first MUX receives the second sequential read address and the second sequential write address as inputs during the second clock cycle and provides the second sequential write address to the first interleaver pattern memory; and
- wherein the second MUX receives the second sequential read address and the second sequential write address as inputs during the second clock cycle and provides the second sequential read address to the second interleaver pattern memory.

7. The interleaver memory structure of claim 1, wherein the interleaver memory structure is employed by a soft-in soft-out (SISO) decoder that includes a top SISO and a bottom SISO;
- wherein the top SISO provides extrinsic information that is fed back to the bottom SISO in an interleaved order during a first SISO operation; and
- wherein the bottom SISO provides extrinsic information that is fed back to the top SISO in a de-interleaved order during a second SISO operation.

8. The interleaver memory structure of claim 1, wherein the interleaver memory structure is employed by a soft-in soft-out (SISO) decoder;
- wherein the SISO decoder is implemented as a single, recycled SISO decoder;
- wherein the SISO provides extrinsic information that is fed back to the SISO in an interleaved order during a first SISO operation; and
- wherein the SISO provides extrinsic information that is fed back to the SISO in a de-interleaved order during a second SISO operation.

9. The interleaver memory structure of claim 1, wherein the plurality of encoded symbols is encoded according to a rate control sequence having a plurality of rate controls arranged in a period.

10. The interleaver memory structure of claim 9, wherein a rate control of the plurality of rate controls includes a modulation that includes a constellation having a mapping.

11. The interleaver memory structure of claim 9, wherein a first rate control of the plurality of rate controls includes a first modulation that includes a first constellation having a first mapping; and wherein a second rate control of the plurality of rate controls includes a second modulation that includes a second constellation having a second mapping.

12. The interleaver memory structure of claim 1, wherein the interleaver memory structure is employed by a soft-in soft-out (SISO) decoder;
- wherein the SISO decoder is part of a decoder that employs a trellis to decode the plurality of encoded symbols;
- wherein the plurality of encoded symbols is encoded according to a rate control sequence having a plurality of rate controls arranged in a period;
- wherein the SISO decoder includes a top SISO and a bottom SISO;
- wherein the top SISO, based on a plurality of trellis metrics, calculates a first plurality of extrinsic values for each encoded symbol of the plurality of encoded symbols according to the respective rate control;
- wherein the interleaver memory structure interleaves the first plurality of extrinsic values to generate a first "a priori probability" (app) information;
- the bottom SISO, based on the plurality of trellis metrics, calculates a second plurality of extrinsic values for each encoded symbol of the plurality of encoded symbols according to the respective rate control;
- wherein the interleaver memory structure de-interleaves the second plurality of extrinsic values to generate a second "a priori probability" (app) information;
- wherein the first "a priori probability" (app) information is fed back to the bottom SISO;
- wherein the second "a priori probability" (app) information is fed back to the top SISO;
- wherein the top SISO and the bottom SISO operate cooperatively to perform at least one iteration of iterative decoding to generate a plurality of soft symbol decisions, each soft symbol decision of the plurality of soft symbol decisions corresponds to an encoded symbol of the plurality of encoded symbols; and
- an output processor, communicatively coupled to the bottom SISO, that generates a hard symbol decision for each soft symbol decision of the plurality of soft symbol decisions thereby making a best estimate for each encoded symbol of the plurality of encoded symbols.

13. The interleaver memory structure of claim 1, wherein the plurality of encoded symbols is encoded according to at least one of TTCM (Turbo Trellis Coded Modulation), PC-TCM (Parallel Concatenated Trellis Coded Modulation), and Trellis Code Modulation (TCM).

14. The interleaver memory structure of claim 1, wherein the interleaver memory structure is employed by a decoder that is implemented within a communication receiver; and
- wherein the communication receiver is contained within at least one of a satellite communication system, a High Definition Television (HDTV) communication system, a cellular communication system, a microwave communication system, a point-to-point communication system, a uni-directional communication system, a bi-directional communication system, a one to many communication system, and a fiber-optic communication system.

15. A soft-in soft-out (SISO) decoder that includes an interleaver memory structure for facilitating the decoding of a plurality of encoded symbols, the SISO decoder comprising:

a top SISO that, based on a plurality of trellis metrics, calculates a first plurality of extrinsic values for each encoded symbol of the plurality of encoded symbols;

wherein the interleaver memory structure interleaves the first plurality of extrinsic values to generate a first "a priori probability" (app) information;

a bottom SISO that, based on the plurality of trellis metrics, calculates a second plurality of extrinsic values for each encoded symbol of the plurality of encoded symbols according to the respective rate control;

wherein the interleaver memory structure de-interleaves the second plurality of extrinsic values to generate a second "a priori probability" (app) information;

wherein the first "a priori probability" (app) information is fed back to the bottom SISO;

wherein the second "a priori probability" (app) information is fed back to the top SISO;

wherein the top SISO and the bottom SISO operate cooperatively to perform at least one iteration of iterative decoding to generate a plurality of soft symbol decisions, each soft symbol decision of the plurality of soft symbol decisions corresponds to an encoded symbol of the plurality of encoded symbols; and an output processor, communicatively coupled to the bottom SISO, that generates a hard symbol decision for each soft symbol decision of the plurality of soft symbol decisions thereby making a best estimate for each encoded symbol of the plurality of encoded symbols;

wherein the interleaver memory structure includes a first interleaver pattern memory, a second interleaver pattern memory, a first interleaver memory, and a second interleaver memory that are all implemented using single port memory structures;

during a first clock cycle:
a first interleaver pattern memory receives a first sequential read address;
a second interleaver pattern memory receives a first sequential write address;

during a second clock cycle:
the first interleaver pattern memory receives a second sequential write address;
the second interleaver pattern memory receives a second sequential read address;
a first read address is received from the first interleaver pattern memory for use by a first interleaver memory;
a first write address is received from the second interleaver pattern memory for use by a second interleaver memory;

during a third clock cycle:
the first interleaver pattern memory receives a third sequential read address;
the second interleaver pattern memory receives a third sequential write address;
a second write address is received from the first interleaver pattern memory for use by the first interleaver memory;
a second read address is received from the second interleaver pattern memory for use by the second interleaver memory;
a first data is read from the first interleaver memory;
a second data is written to the second interleaver memory; and
wherein each of the first interleaver pattern memory, the second interleaver pattern memory, the first interleaver memory, and the second interleaver memory are implemented using single port memory structures.

16. The SISO decoder of claim 15, wherein the plurality of encoded symbols is encoded according to a rate control sequence having a plurality of rate controls arranged in a period.

17. The SISO decoder of claim 16, wherein a rate control of the plurality of rate controls includes a modulation that includes a constellation having a mapping.

18. The SISO decoder of claim 16, wherein a first rate control of the plurality of rate controls includes a first modulation that includes a first constellation having a first mapping; and
wherein a second rate control of the plurality of rate controls includes a second modulation that includes a second constellation having a second mapping.

19. The SISO decoder of claim 15, wherein:
during a fourth clock cycle:
the first interleaver pattern memory receives a fourth sequential write address;
the second interleaver pattern memory receives a fourth sequential read address;
a third read address is received from the first interleaver pattern memory for use by the first interleaver memory;
a third write address is received from the second interleaver pattern memory for use by the second interleaver memory;
a third data is written to the first interleaver memory; and
a fourth data is read from the second interleaver memory.

20. The SISO decoder of claim 15, wherein read accesses and write accesses are alternatively performed within each of the first interleaver memory and the second interleaver memory.

21. The SISO decoder of claim 15, wherein the first sequential read address and the first sequential write address are offset by an odd value.

22. The SISO decoder of claim 15, wherein the second sequential write address and the second sequential write address are offset by an odd value.

23. The SISO decoder of claim 15, wherein the interleaver memory structure further comprises:
a first multiplexor (MUX) that receives the first sequential read address and the first sequential write address as inputs during the first clock cycle and provides the first sequential read address to the first interleaver pattern memory;
a second multiplexor (MUX) that receives the first sequential read address and the first sequential write address as inputs during the first clock cycle and provides the first sequential write address to the second interleaver pattern memory;
wherein the first MUX receives the second sequential read address and the second sequential write address as inputs during the second clock cycle and provides the second sequential write address to the first interleaver pattern memory; and
wherein the second MUX receives the second sequential read address and the second sequential write address as inputs during the second clock cycle and provides the second sequential read address to the second interleaver pattern memory.

24. The SISO decoder of claim 15, wherein the plurality of encoded symbols is encoded according to at least one of TTCM (Turbo Trellis Coded Modulation), PC-TCM (Parallel Concatenated Trellis Coded Modulation), and Trellis Code Modulation (TCM).

25. The SISO decoder of claim 15, wherein the SISO decoder is implemented within a communication receiver; and wherein the communication receiver is contained within at least one of a satellite communication system, a High Definition Television (HDTV) communication system, a cellular communication system, a microwave communication system, a point-to-point communication system, a uni-directional communication system, a bi-directional communication system, a one to many communication system, and a fiber-optic communication system.

26. An interleaver memory processing method, the method comprising:

during a first clock cycle:
providing a first sequential read address to a first interleaver pattern memory;
providing a first sequential write address to a second interleaver pattern memory;

during a second clock cycle:
providing a second sequential write address to the first interleaver pattern memory;
providing a second sequential read address to the second interleaver pattern memory;
receiving a first read address from the first interleaver pattern memory for use by a first interleaver memory;
receiving a first write address from the second interleaver pattern memory for use by a second interleaver memory;

during a third clock cycle:
providing a third sequential read address to the first interleaver pattern memory;
providing a third sequential write address to the second interleaver pattern memory;
receiving a second write address from the first interleaver pattern memory for use by the first interleaver memory;
receiving a second read address from the second interleaver pattern memory for use by the second interleaver memory;
reading a first data from the first interleaver memory; and
writing a second data to the second interleaver memory.

27. The method of claim 26, wherein:
during a fourth clock cycle:
providing a fourth sequential write address to the first interleaver pattern memory;
providing a fourth sequential read address to the second interleaver pattern memory;
receiving a third read address from the first interleaver pattern memory for use by the first interleaver memory;
receiving a third write address from the second interleaver pattern memory for use by the second interleaver memory;
writing a third data to the first interleaver memory; and
reading a fourth data from the second interleaver memory.

28. The method of claim 26, wherein read accesses and write accesses are alternatively performed within each of the first interleaver memory and the second interleaver memory.

29. The method of claim 26, wherein the first sequential read address and the first sequential write address are offset by an odd value.

30. The method of claim 26, wherein the second sequential write address and the second sequential write address are offset by an odd value.

31. The method of claim 26, wherein the plurality of encoded symbols is encoded according to a rate control sequence having a plurality of rate controls arranged in a period.

32. The method of claim 31, wherein a rate control of the plurality of rate controls includes a modulation that includes a constellation having a mapping.

33. The method of claim 31, wherein a first rate control of the plurality of rate controls includes a first modulation that includes a first constellation having a first mapping; and wherein a second rate control of the plurality of rate controls includes a second modulation that includes a second constellation having a second mapping.

34. The method of claim 26, wherein the plurality of encoded symbols is encoded according to at least one of TTCM (Turbo Trellis Coded Modulation), PC-TCM (Parallel Concatenated Trellis Coded Modulation), and Trellis Code Modulation (TCM).

35. The method of claim 26, wherein the method is performed within a decoder that is implemented within a communication receiver;

wherein the communication receiver is contained within at least one of a satellite communication system, a High Definition Television (HDTV) communication system, a cellular communication system, a microwave communication system, a point-to-point communication system, a uni-directional communication system, a hi-directional communication system, a one to many communication system, and a fiber-optic communication system.

* * * * *